(12) United States Patent
Levinski et al.

(10) Patent No.: US 12,253,805 B2
(45) Date of Patent: Mar. 18, 2025

(54) SCATTEROMETRY OVERLAY METROLOGY WITH ORTHOGONAL FINE-PITCH SEGMENTATION

(71) Applicant: KLA Corporation, Milpitas, CA (US)

(72) Inventors: Vladimir Levinski, Nazareth Ilit (IL); Daria Negri, Nesher (IL); Amnon Manassen, Haifa (IL)

(73) Assignee: KLA Corporation, Milpitas, CA (US)

( * ) Notice: Subject to any disclaimer, the term of this patent is extended or adjusted under 35 U.S.C. 154(b) by 163 days.

(21) Appl. No.: 17/885,909

(22) Filed: Aug. 11, 2022

(65) Prior Publication Data
US 2024/0053687 A1 Feb. 15, 2024

(51) Int. Cl.
  G03F 7/00 (2006.01)
  G01N 21/95 (2006.01)

(52) U.S. Cl.
  CPC ..... *G03F 7/70633* (2013.01); *G01N 21/9501* (2013.01); *G03F 7/70683* (2013.01)

(58) Field of Classification Search
  CPC .................................................. G03F 7/70633
  See application file for complete search history.

(56) References Cited

U.S. PATENT DOCUMENTS

| | | |
|---|---|---|
| 7,599,064 B2 | 10/2009 | Mos et al. |
| 10,337,991 B2 | 7/2019 | Levinski |
| 2011/0204484 A1* | 8/2011 | Van Der Schaar ........... G03F 7/70566 438/758 |
| 2015/0177135 A1 | 6/2015 | Amit et al. |
| 2016/0033398 A1* | 2/2016 | Kim ..................... H01L 23/544 356/243.1 |
| 2017/0090302 A1* | 3/2017 | Slotboom ........... G03F 7/70633 |
| 2018/0031470 A1* | 2/2018 | Levinski ............ G01B 11/2536 |
| 2018/0188663 A1* | 7/2018 | Levinski ............ G03F 7/70625 |
| 2019/0033726 A1* | 1/2019 | Adam ....................... G06T 7/80 |
| 2020/0103772 A1* | 4/2020 | Goorden .............. G01B 11/272 |
| 2020/0241429 A1 | 7/2020 | Yang et al. |
| 2021/0072021 A1 | 3/2021 | Hill et al. |

OTHER PUBLICATIONS

Korean Intellectual Property Office, International Search Report and Written Opinion for International Application No. PCT/US2023/028085, Nov. 7, 2023, 13 pages.

* cited by examiner

*Primary Examiner* — Steven H Whitesell
(74) *Attorney, Agent, or Firm* — Suiter Swantz IP

(57) ABSTRACT

An overlay metrology target may include grating-over-grating structures formed from a lower grating structure with a first coarse pitch in a first sample layer and an upper grating structure with a second coarse pitch in a second sample layer, where the upper and lower grating structures overlap on the sample. At least one of the upper grating structure or the lower grating structure may include features with a fine pitch smaller than a wavelength of an illumination beam and arranged to rotate first-order diffraction of the illumination beam associated with at least one of the first or second coarse pitches with respect to at least one of specular reflection from a top surface of the sample or zero-order diffraction from the one or more grating structures. Overlay between the first and second layers of the sample is determinable from an image of the grating structures based on the first-order diffraction.

45 Claims, 15 Drawing Sheets

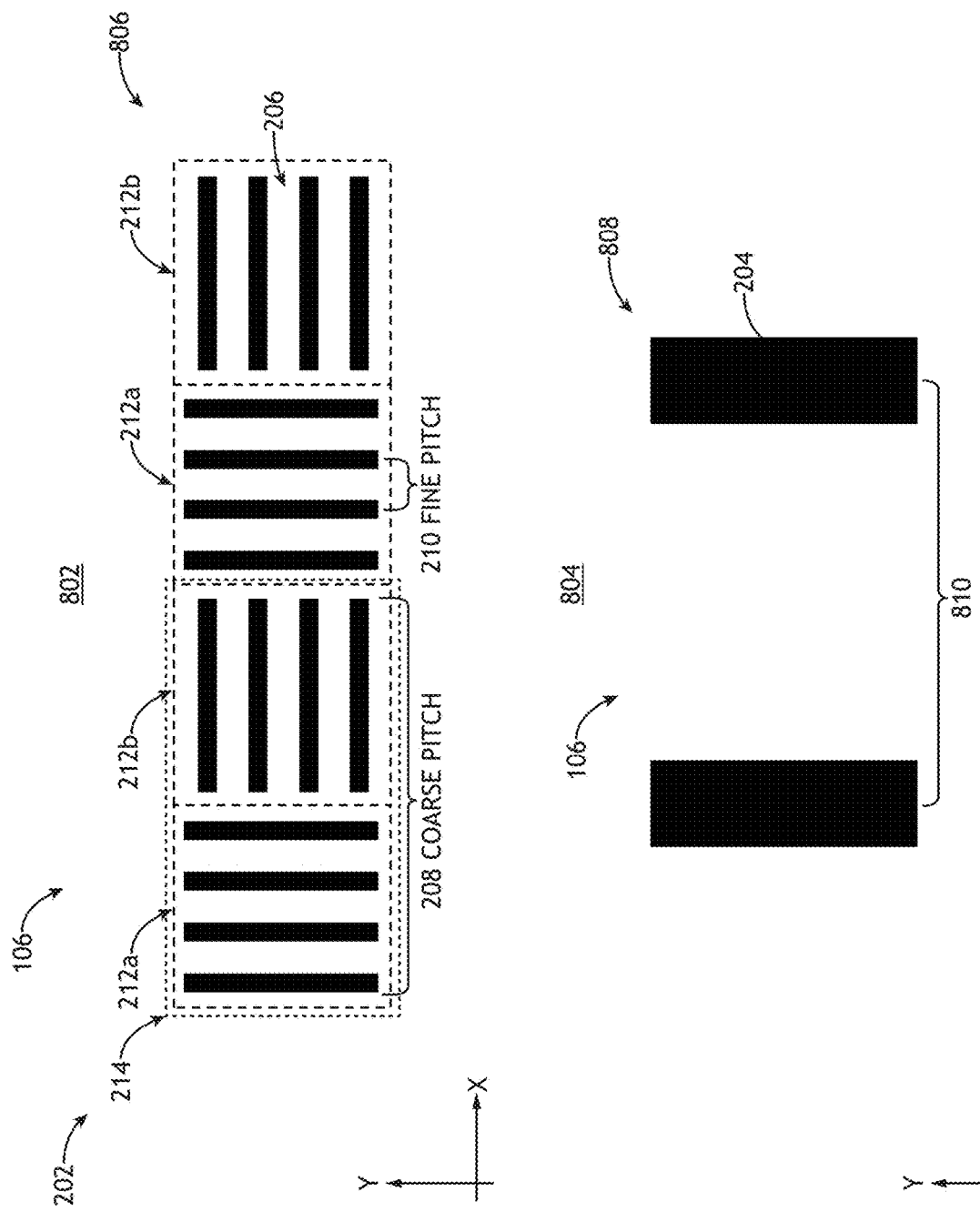

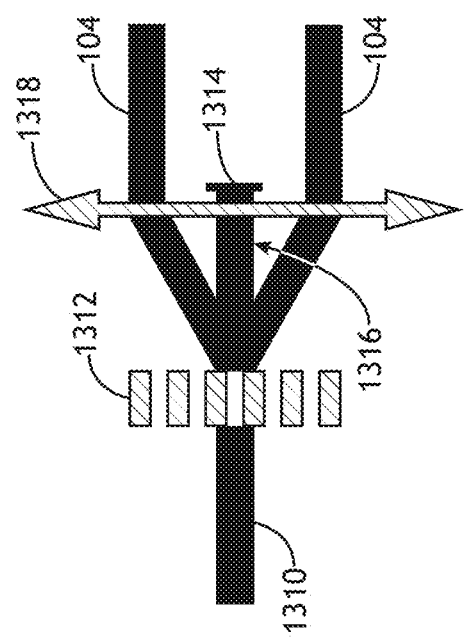
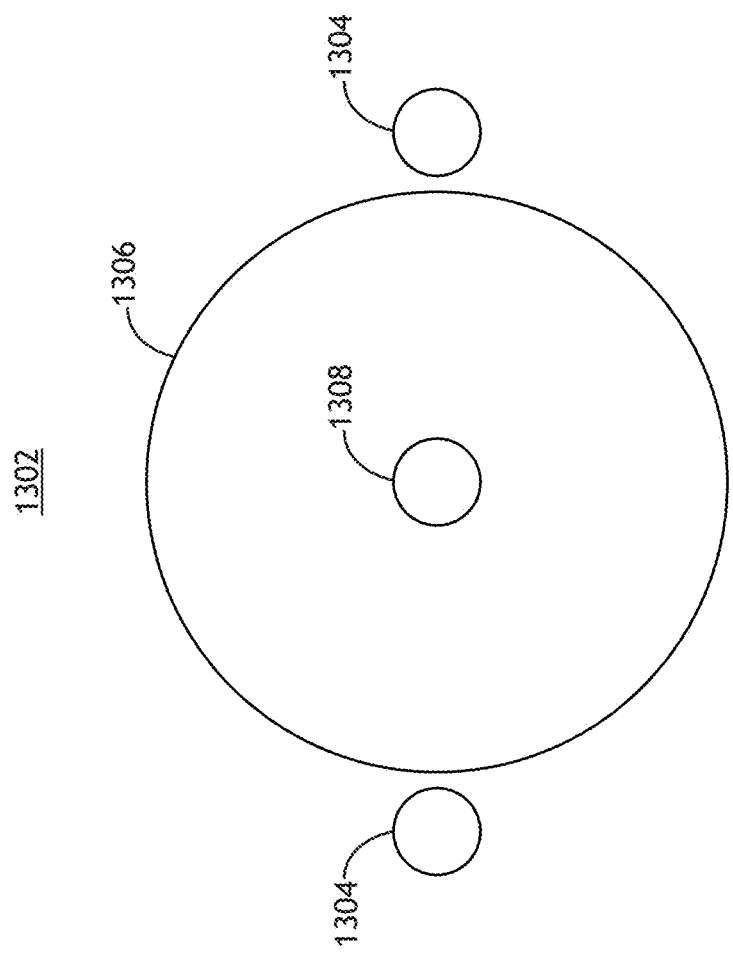
FIG. 13B
FIG. 13A

SCATTEROMETRY OVERLAY METROLOGY WITH ORTHOGONAL FINE-PITCH SEGMENTATION

TECHNICAL FIELD

The present disclosure relates generally to scatterometry overlay metrology and, more particularly, to scatterometry overlay metrology on targets with orthogonal fine pitches.

BACKGROUND

Overlay metrology techniques utilizing grating-over-grating structures such as, but not limited to scatterometry overlay (SCOL) or Moiré techniques provide relatively compact overlay targets. However, such techniques may suffer from reduced contrast or signal to noise ratios due to the presence of unwanted signals such as, but not limited to, specular reflection (e.g., DC signals). There is therefore a need to develop systems and methods to cure the above deficiencies.

SUMMARY

An overlay metrology system is disclosed in accordance with one or more illustrative embodiments. In one illustrative embodiment, the system includes an illumination source configured to generate an illumination beam. In another illustrative embodiment, the system includes one or more illumination optics to direct the illumination beam to a sample with a field of view including one or more overlay targets when implementing a metrology recipe. In another illustrative embodiment, a particular one of the one or more overlay targets in accordance with the metrology recipe includes one or more grating-over-grating structures formed from a lower grating structure with a first coarse pitch and an upper grating structure with a second coarse pitch, where the upper and lower grating structures overlap on the sample. In another illustrative embodiment, at least one of the upper grating structure or the lower grating structure further includes features with a fine pitch smaller than a wavelength of the illumination beam and arranged to rotate first-order diffraction of the illumination beam associated with at least one of the first or second coarse pitches with respect to at least one of specular reflection from a top surface of the sample or zero-order diffraction from the one or more grating-over-grating structures. In another illustrative embodiment, the system includes an objective lens to collect light from the sample within the field of view when implementing the metrology recipe. In another illustrative embodiment, the system includes a polarizer arranged to pass portions of the light from the sample associated with first-order diffraction. In another illustrative embodiment, the system includes a detector to generate an image of the sample including the one or more overlay targets. In another illustrative embodiment, the system includes a controller to execute program instructions causing the one or more processors to determine overlay measurements of the sample based on the image of the one or more overlay targets.

An overlay metrology target is disclosed in accordance with one or more illustrative embodiments. In one illustrative embodiment, the target includes one or more grating-over-grating structures formed from a lower grating structure with a first coarse pitch in a first layer of a sample and an upper grating structure with a second coarse pitch in a second layer of the sample, where the upper and lower grating structures overlap on the sample. In another illustrative embodiment, at least one of the upper grating structure or the lower grating structure further includes features with a fine pitch smaller than a wavelength of an illumination beam and arranged to rotate first-order diffraction of the illumination beam associated with at least one of the first or second coarse pitches with respect to at least one of specular reflection from a top surface of the sample or zero-order diffraction from the one or more grating structures. In another illustrative embodiment, overlay between the first and second layers of the sample is determinable from an image of the one or more grating structures based on the first-order diffraction.

An overlay metrology method is disclosed in accordance with one or more illustrative embodiments. In one illustrative embodiment, the method includes fabricating one or more overlay targets on a sample. In another illustrative embodiment, a particular one of the one or more overlay targets includes one or more grating-over-grating structures formed from a lower grating structure with a first coarse pitch and an upper grating structure with a second coarse pitch, where the upper and lower grating structures overlap on the sample. In another illustrative embodiment, at least one of the upper grating structure or the lower grating structure further includes features with a fine pitch smaller than a wavelength of an illumination beam and arranged to rotate first-order diffraction of the illumination beam associated with at least one of the first or second coarse pitches with respect to at least one of specular reflection from a top surface of the sample or zero-order diffraction from the one or more grating-over-grating structures. In another illustrative embodiment, the method includes illuminating the one or more of overlay targets with the illumination beam. In another illustrative embodiment, the method includes generating an image of the sample through a polarizer aligned to pass the first-order diffraction. In another illustrative embodiment, the method includes determining overlay measurements based on the image of the sample.

An overlay metrology system is disclosed in accordance with one or more illustrative embodiments. In one illustrative embodiment, the system includes an illumination source configured to generate at least one illumination beam. In another illustrative embodiment, the system includes one or more illumination optics to direct the illumination beam to a sample at an oblique angle with a field of view including one or more overlay targets when implementing a metrology recipe. In another illustrative embodiment, a particular one of the one or more overlay targets includes one or more Moiré grating-over-grating structures formed from a lower grating structure with a first coarse pitch and an upper grating structure with a second coarse pitch different than the first pitch, where the upper and lower grating structures overlap on the sample. In another illustrative embodiment, the system includes an objective lens to collect light diffraction from the sample within the field of view when implementing the metrology recipe, where at least one of specular reflection from the sample or zero-order diffraction from the one or more overlay targets is outside a collection numerical aperture of the objective lens. In another illustrative embodiment, the system includes a detector to generate an image of the sample including the one or more overlay targets. In another illustrative embodiment, the system includes a controller to determine overlay measurements of the sample based on the image of the one or more overlay targets.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

FIG. 8A is a top view of an overlay target suitable for polarization-based isolation of first-order diffraction along a single measurement direction, in accordance with one or more embodiments of the present disclosure.

FIG. 13A is a top view of a collection pupil of an overlay metrology sub-system, in accordance with one or more embodiments of the present disclosure.

FIG. 13B is a conceptual view of the generation of two illumination beams from an incoherent light source, in accordance with one or more embodiments of the present disclosure.

DETAILED DESCRIPTION

Figure 1A:
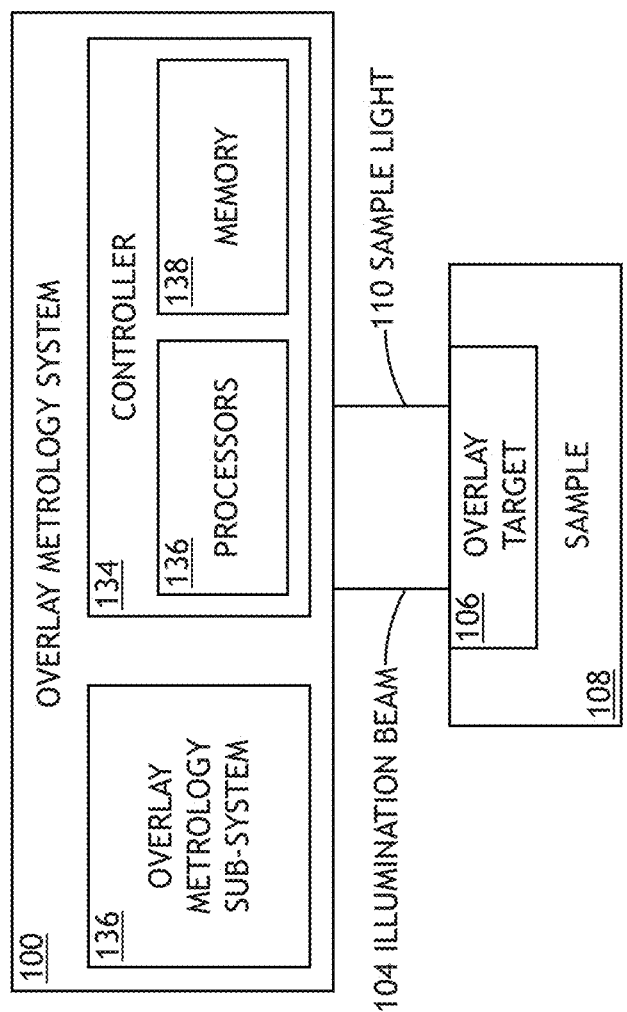
FIG. 1A is a conceptual view illustrating an overlay metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for overlay metrology using overlay targets with grating-over-grating structures in which selected diffraction orders used for a measurement are optically isolated using polarization control. Put another way, some embodiments of the present disclosure are directed to systems and methods for overlay metrology using overlay targets with a grating-over-grating structure in which at least a portion of an unwanted light signal emanating from the sample (e.g., light from the sample that may not contribute to an overlay measurement) is blocked using polarization control. As a non-limiting illustration, it may be desirable in some overlay measurement techniques to block pure reflection from a sample that does not interact both gratings of a grating-over-grating structure (e.g., reflection from a top surface of the sample), which is referred to herein as a DC signal to differentiate such a signal from zero-order diffraction from both gratings. It is contemplated herein that such DC signals may be relatively strong compared to various diffraction orders from a grating over grating structure and may thus reduce a contrast of a measurement.

For the purposes of the present disclosure, the term "grating-over-grating structure" is used to refer to a set of features in overlapping regions of two or more layers of a sample, where the features on each of the layers have periodicities that may be characterized by at least one pitch or spatial frequency. In this way, the features in the overlapping regions are described as grating structures. However, it is to be understood that grating structures on a particular sample layer may be characterized by multiple pitches along a particular direction and/or by multiple pitches along different directions. The constituent features of a grating-over-grating structure may thus be segmented to provide multiple pitches in any combination of directions or otherwise distributed to provide spatial frequencies suitable for generating diffraction of incident light.

Additionally, optical isolation of selected diffraction orders from an overlay target including grating-over-grating structures may also block signals from other features on a sample (e.g., device features, dummy features, or the like) such that multiple overlay targets within a field of view may be characterized simultaneously. Such a measurement approach may enable extremely high throughput measurements.

An overlay target and/or an overlay metrology tool suitable for characterizing the overlay target may be configured according to a metrology recipe suitable for generating overlay measurements based on a desired technique. More generally, an overlay metrology tool may be configurable according to a variety of metrology recipes to perform overlay measurements using a variety of techniques and/or perform overlay measurements on a variety of overlay targets with different designs.

For example, a metrology recipe may include various aspects of an overlay target or a design of an overlay target including, but not limited to, a layout of target features on one or more sample layers, feature sizes, or feature pitches. As another example, a metrology recipe may include illumination parameters such as, but not limited to, an illumination wavelength, an illumination pupil distribution (e.g., a distribution of illumination angles and associated intensities of illumination at those angles), a polarization of incident illumination, a spatial distribution of illumination, or a sample height. By way of another example, a recipe of an overlay metrology tool may include collection parameters such as, but not limited to, a collection pupil distribution (e.g., a desired distribution of angular light from the sample to be used for a measurement and associated filtered intensities at those angles), collection field stop settings to select portions of the sample of interest, polarization of collected light, or wavelength filters.

Some embodiments of the present disclosure are directed to overlay targets suitable for providing polarization-based optical isolation of a selected diffraction order from a grating over grating structure such as, but not limited to, first-order diffraction. Some embodiments of the present disclosure are directed to overlay measurement techniques (e.g., implementable using a metrology recipe) suitable for measuring overlay on overlay targets based on polarization-based optical isolation of a selected diffraction order. Some embodiments of the present disclosure are directed to an overlay metrology tool that is configurable (e.g., based on a metrology recipe) to perform overlay metrology based on polarization-based optical isolation of a selected diffraction order.

In some embodiments, an overlay target suitable for overlay metrology based on polarization-based isolation of first-order diffracted light includes at least one grating-over-grating structure in which a grating on a first layer includes features that impart different phase changes on orthogonally-polarized light components of first-order diffracted light. The use of polarizing target features to provide control of the amplitude and phase of diffraction orders is described generally in U.S. Pat. No. 10,337,991 issued on Jul. 2, 2019, which is incorporated herein by reference in its entirety. It is contemplated herein that some embodiments of the present disclosure may extend the use of polarizing target features described in U.S. Pat. No. 10,337,991 to multiple overlay metrology techniques utilizing grating-over-grating structures and further extend the use of polarizing target features described in U.S. Pat. No. 10,337,991 to high-throughput overlay measurements based on simultaneous imaging of multiple overlay targets in a single image grab.

A grating over grating structure may be formed from periodic structures (e.g., gratings or grating structures more generally) from different lithographic exposures on two layers in overlapping areas of an overlay target (e.g., an upper layer and a lower layer). Light incident on a grating over grating structure may thus interact with the gratings on each layer such that diffraction orders emanating from the overlay target may be impacted by, among other things, relative positions of the grating structures. As a result, an overlay measurement associated with the relative registration (or misregistration) of the sample layers may be based on one or more diffraction orders of light that interact with grating structures in each of the layers of interest.

For example, such a grating on a first layer of an overlay target may include features arranged to provide that a phase of first-order diffraction along a Y direction is shifted by $\pi$ relative to a phase of first-order diffraction along an X direction. Put another way, the grating on the first layer may have a different effective permittivity along the X relative to an orthogonal Y direction. In this way, the grating on the first layer may operate as a waveplate for first-order diffraction but not for other light from the sample such as, but not limited to, zero-order diffraction, a DC signal, or higher-order diffraction. The grating on the first layer may thus rotate the polarization of first-order diffracted light relative to other light. Further, the grating on the second layer of the overlay target may have any design and need not impact the polarization of light. In this way, such an overlay target may be formed with the first layer on a process layer having relatively high contrast between grating features and surround material necessary to modify the polarization of first-order diffraction and with the second layer in a resist layer. For the purposes of the present disclosure, the term process layer refers to a layer having one or more features fabricated using various processing steps including, but not limited to, a lithography step (e.g., in a photomask deposited on the layer) followed by an etching step. In this way, the features in a process layer be of a different material than a surrounding material, which may be air (e.g., unfilled) or an additional material such as, but not limited to, an oxide. For the purposes of the present disclosure, features in a resist layer refer to features in a photoresist generated through a lithographic exposure prior to an etching step.

An overlay metrology tool configured (e.g., according to a metrology recipe) to perform overlay metrology with such an overlay target may illuminate the overlay target with linearly polarized light and include a polarizer in a collection pathway having an orthogonal polarization. In this way, the collection pathway may selectively pass first-order diffraction that has been polarization rotated by the first layer of the overlay target and may block non-rotated light including, but not limited to, a DC signal or diffraction other than first-order diffraction. As a result, signals associated with the first-order diffraction may have high contrast and/or a high signal to noise ratio.

It is contemplated herein that overlay metrology based on polarization-based isolation of first-order diffraction may be implemented in any overlay technique (and associated overlay target design) based on first-order diffraction. It is contemplated herein that such a technique may be particularly beneficial for, but is not limited to, mitigating DC reflections that may reduce the contrast and/or signal to noise ratio of an overlay measurement.

Some embodiments of the present disclosure are directed to scatterometry overlay (SCOL) techniques and associated overlay targets. SCOL overlay metrology techniques may utilize overlay targets including grating-over-grating structures in which the constituent grating features have common pitches. Such targets are referred to herein as SCOL targets.

It is recognized herein that a traditional zero-order SCOL metrology technique is based on the grating-over-grating target design in which an upper grating and a bottom grating have the same pitch. Further, each photon emitted from any point in the illumination pupil is scattered on the upper and lower gratings and vice versa so that the measured zero order signal includes overlay information due to $\pm 1$, $\pm 2$ . . . diffraction order combinations from upper and bottom gratings.

One problem with this approach is a large DC signal due to pure zero order reflection along with algorithmic inaccuracy which stems from the various combinations of diffraction orders that contribute to the measured signal. In particular, all of these possible combinations of diffraction orders that contribute to the measured signal cannot practically be taken into account by a model based on a relatively small number of cells with predefined offsets between the upper and lower gratings. For example, the number of cells associated with a measurement and thus reflected in such a model may be limited by considerations such as, but not limited to, target size and move-acquire-measurement (MAM) throughput considerations.

It is further recognized that similar problems arise when using a Moiré overlay target with a relatively large gain (e.g., >300). Further, a Moiré target with gains on the order of 10 to 300-400 may be impractical due to an inherent ambiguity in an overlay measurement with these values. For example, it may be impractical or impossible to use techniques such as dark field illumination to address the DC signal.

Some embodiments of the present disclosure are directed to SCOL targets in which gratings in one layer may rotate a polarization of first-order diffraction relative to other light from the sample (e.g., a DC signal, zero-order diffraction, or higher-order diffraction). In this way, an overlay metrology tool may provide polarization-based isolation of first-order diffraction. Such a target may be utilized with any SCOL overlay technique utilizing first-order diffraction.

Some embodiments of the present disclosure are directed to Moiré overlay techniques and associated overlay targets. Moiré overlay metrology techniques may utilize overlay targets including one or more grating over grating structures in which the constituent gratings have different pitches. Such targets are referred to herein as Moiré targets and provide diffraction from both gratings (e.g., double diffraction) in addition to typical diffraction orders from each of the gratings. For example, a Moiré target may generate a Moiré diffraction order with a relatively small diffraction angle based on a gain factor associated with a difference between the pitches of the constituent gratings. Moiré targets may be used in a variety of measurement modes. An image of a Moiré target may thus include a periodic signal based on this Moiré diffraction order (e.g., a signal with a Moiré pitch) even if the pitches of the constituent gratings are not resolvable. Further, since the Moiré pitch is typically larger than the pitches associated with the constituent gratings (e.g., by the gain factor), Moiré overlay techniques may provide overlay measurements with a sensitivity amplified by the gain factor. Moiré targets may also be characterized by pupil-based measurement techniques.

Some embodiments of the present disclosure are directed to high-throughput overlay measurements based on simultaneously capturing signals from multiple overlay targets (sometimes hundreds of overlay targets or more). It is contemplated herein that overlay targets including grating-over-grating structures in which one grating rotates the polarization of first-order diffraction relative to other light from the overlay target may enable isolated imaging of the targets based on this first-order diffraction. For example, an overlay measurement based on illumination with linearly-polarized light and collection with a crossed-polarizer (e.g., a polarizer in a collection pathway oriented to exclude unrotated polarizations) may optically isolate first-order diffraction from the overlay targets and block other light including, but not limited to, additional light from the overlay targets and light from device features. As a result, an image with a field of view including multiple overlay targets may reveal the overlay targets with a high contrast.

It is noted that the use of polarization rotating targets (e.g., within a process layer) provides first-order diffraction from two layers with perpendicular polarization. This may generally be beneficial for multiple overlay metrology techniques. For example, this may be beneficial for optical SCOL techniques in which a Moiré signal is obtained as interference in the field of +1 orders from grating structures in two layers in one detector and −1 orders from grating structures in the two layers in a second detector. A polarizer aligned at a suitable angle can then be used to equalize the amplitudes of the diffraction orders from the grating structures and thus improve a signal to noise ratio. Similar techniques may be applied in typical imaging overlay metrology techniques in order to equalize the contrast of signals from layers formed from different materials (e.g., from grating structures in resist and process layers).

Referring now to FIGS. 1A-13B, systems and methods for overlay metrology using on polarization-based isolation of selected diffraction orders of light is described in greater detail, in accordance with one or more embodiments of the present disclosure.

FIG. 1A is a conceptual view illustrating an overlay metrology system 100, in accordance with one or more embodiments of the present disclosure.

In some embodiments, the overlay metrology system 100 includes an overlay metrology sub-system 102 to acquire overlay signals from overlay targets based on any number of overlay recipes. For example, the overlay metrology sub-system 102 may direct at least one illumination beam 104 to an overlay target 106 on a sample 108 and may further collect light or other electromagnetic radiation (referred to herein as sample light 110) emanating from the overlay target 106, where at least a portion of the sample light 110 is used to generate one or more images of the overlay target 106. In this way, one or more overlay measurements of the sample 108 (e.g., overlay measurements associated with a registration or misregistration of two or more layers of the sample 108) may be generated based on at least one image of the overlay target 106.

Further, the overlay metrology sub-system 102 may be configurable to generate images based on any number of metrology recipes defining measurement parameters for image acquisition and/or design parameters of an overlay target 106 to be imaged. For example, a metrology recipe may include various aspects of an overlay target 106 or a design of an overlay target 106 including, but not limited to, a layout of target features on one or more sample layers, feature sizes, or feature pitches. As another example, a metrology recipe may include illumination parameters such as, but not limited to, an illumination wavelength, an illumination pupil distribution (e.g., a distribution of illumination angles and associated intensities of illumination at those angles), a polarization of incident illumination, a spatial distribution of illumination, or a sample height. By way of another example, a metrology recipe may include collection parameters such as, but not limited to, a collection pupil distribution (e.g., a desired distribution of angular light from the sample 108 to be used for a measurement and associated filtered intensities at those angles), collection field stop settings to select portions of the sample of interest, polarization of collected light, or wavelength filters.

The overlay metrology sub-system 102 may be any type of overlay metrology tool known in the art suitable for generating overlay signals suitable for determining overlay associated with overlay targets 106 on a sample 108.

In some embodiments, the overlay metrology sub-system 102 generates an image of an overlay target 106 in which one or more features of the overlay target 106 are not resolved. For example, an overlay metrology sub-system 102 may be configured (e.g., based on a metrology recipe) to form an image of an overlay target 106 based on light from a single diffraction order or light from multiple diffraction orders that do not combine in such a way as to provide a resolved image of the overlay target 106 or selected features therein. As an illustration, an image of an overlay target 106 associated with a zero-order SCOL technique may include unresolved grating-over-grating structures, where the unresolved grating-over-grating structures are represented as greyscale regions. In this configuration, an intensity of a particular greyscale region is impacted by a physical overlay (e.g., a physical misregistration associated with an intended offset if applicable and an unintended overlay error) of that grating-over-grating structure. In this way, the overlay metrology sub-system 102 may generate an overlay measurement of the sample 108 (e.g., a measurement of the unintended overlay error) based on imaged intensities of unresolved grating-over-grating features in multiple cells of the overlay target 106. As another illustration, an image of an overlay target 106 associated with a Moiré technique may include unresolved grating-over-grating structures, but may include a resolved periodic signal associated with Moiré diffraction (e.g., double diffraction) from the constituent gratings.

Figure 1B:
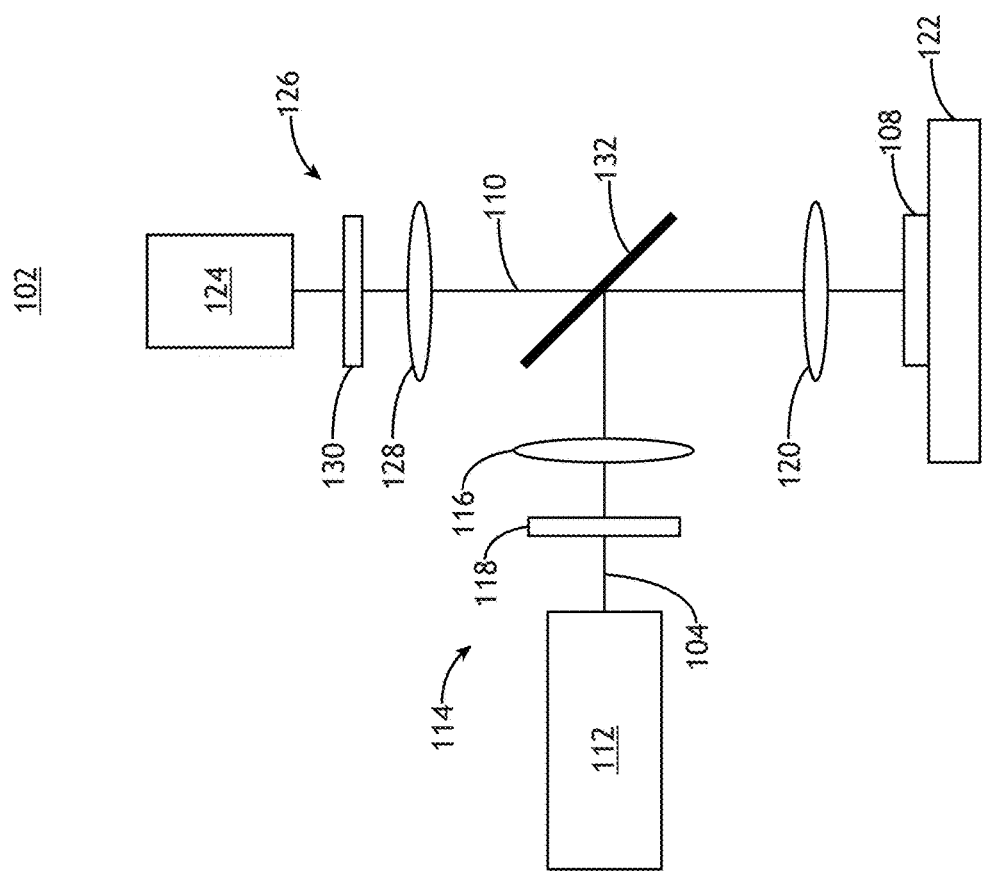
FIG. 1B is a conceptual view illustrating the overlay metrology sub-system, in accordance with one or more embodiments of the present disclosure.

FIG. 1B is a conceptual view illustrating the overlay metrology sub-system 102, in accordance with one or more embodiments of the present disclosure. In some embodiments, the overlay metrology sub-system 102 includes an illumination source 112 configured to generate an illumination beam 104. The illumination beam 104 may include one or more selected wavelengths of light including, but not limited to, ultraviolet (UV) radiation, visible radiation, or infrared (IR) radiation.

In some embodiments, the overlay metrology sub-system 102 directs the illumination beam 104 to the sample 108 or a portion thereof including at least one overlay target 106 via an illumination pathway 114. The illumination pathway 114 may include one or more optical components suitable for modifying and/or conditioning the illumination beam 104 as well as directing the illumination beam 104 to the sample 108. For example, the illumination pathway 114 may include, but is not required to include, one or more lenses 116 (e.g., to collimate the illumination beam 104, to relay pupil and/or field planes, or the like), one or more illumination polarizers 118 to adjust the polarization of the illumination beam 104, one or more filters, one or more beam splitters, one or more diffusers, one or more homogenizers, one or more apodizers, one or more beam shapers, or one or more mirrors (e.g., static mirrors, translatable mirrors, scanning mirrors, or the like). In some embodiments, the overlay metrology sub-system 102 includes an objective lens 120 to focus the illumination beam 104 onto the sample 108 (e.g., an overlay target 106 with overlay target elements located on two or more layers of the sample 108). In some embodiments, the sample 108 is disposed on a sample stage 122 suitable for securing the sample 108 and further configured to position the sample 108 with respect to the illumination beam 104.

In some embodiments, the overlay metrology sub-system 102 includes one or more detectors 124 configured to capture sample light 110 emanating from the sample 108 through a collection pathway 126 and generate one or more overlay signals indicative of overlay of two or more layers of the sample 108. The collection pathway 126 may include multiple optical elements to direct and/or modify illumination collected by the objective lens 120 including, but not limited to one or more lenses 128, one or more filters, one or more collection polarizers 130, one or more beam blocks, or one or more beamsplitters. For example, a detector 124 may receive an optical image of the sample 108 provided by elements in the collection pathway 126 (e.g., the objective lens 120, the one or more lenses 128, or the like). By way of another example, a detector 124 may receive radiation reflected or scattered (e.g., via specular reflection, diffuse reflection, and the like) from the sample 108. By way of another example, a detector 124 may receive one or more diffracted orders of radiation from the overlay target 106 (e.g., 0-order diffraction, ±1 order diffraction, ±2 order diffraction, and the like).

The illumination pathway 114 and the collection pathway 126 of the overlay metrology sub-system 102 may be oriented in a wide range of configurations suitable for illuminating the overlay target 106 with the illumination beam 104 and collecting the sample light 110 in response to the incident illumination beam 104. For example, as illustrated in FIG. 1B, the overlay metrology sub-system 102 may include a beamsplitter 132 oriented such that the objective lens 120 may simultaneously direct the illumination beam 104 to the overlay target 106 and collect radiation emanating from the sample 108. By way of another example, the illumination pathway 114 and the collection pathway 126 may contain non-overlapping optical paths.

Referring now to FIGS. 2-10, designs of an overlay target 106 suitable for polarization-based isolation of first-order diffraction are described in greater detail, in accordance with one or more embodiments of the present disclosure. FIGS. 2-7 illustrate various non-limiting examples of features suitable for rotating a polarization of first-order diffraction relative to other sample light 110 such as, but not limited to, a DC signal, zero-order diffraction, or higher-order diffraction. Such features are referred to herein as polarization-rotating features. It is contemplated herein that an overlay target 106 in accordance with the systems and methods disclosed herein may be formed from or otherwise include a grating-over-grating structure in which at least one of the layers includes polarization-rotating features. FIGS. 8A-10 then depict various non-limiting examples of overlay targets 106 that include polarization-rotating features.

In some embodiments, an overlay target 106 includes at least one grating-over-grating structure in which features on at least one of the layers of the sample 108 rotate a polarization of first-order diffraction relative to other light emanating from the grating-over-grating structure such as, but not limited to, DC reflection, zero-order diffraction, or higher-order diffraction.

A grating-over-grating structure may have any combination or orientation of features suitable for providing rotation of first-order diffraction. In some embodiments, a grating-over-grating structure includes features on at least one sample layer having a coarse pitch that are further segmented (e.g., by a fine pitch) in orthogonal directions. Further, the fine pitch may be smaller than a wavelength of light such that the orthogonal segmentation at the fine pitch may provide a different effective permittivity for light polarized along orthogonal directions.

Figure 2:
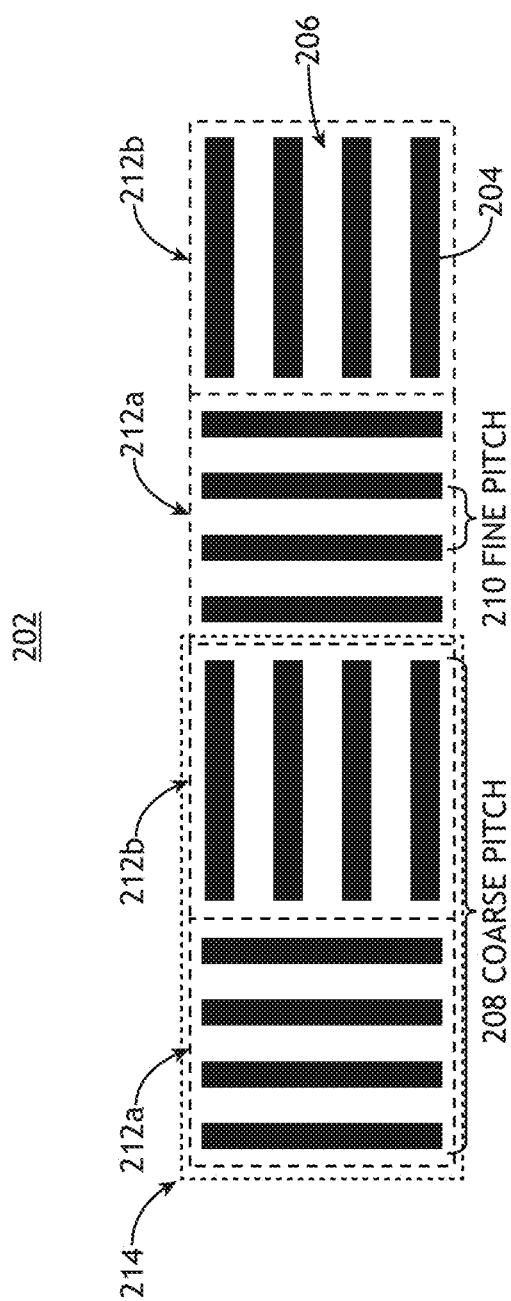
FIG. 2 is a top view of polarization-rotating features located on a first layer of an overlay target, in accordance with one or more embodiments of the present disclosure.
Figure 3:
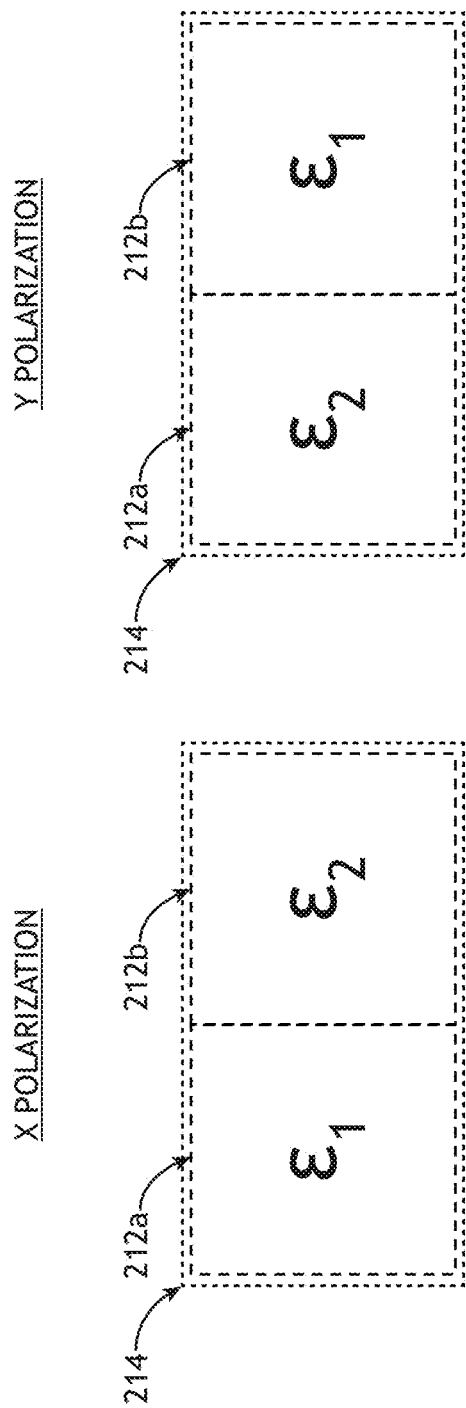
FIG. 3A depicts an effective medium representation of structures within a period associated with the coarse pitch for light polarized along the X direction as defined in FIG. 2, in accordance with one or more embodiments of the present disclosure.
FIG. 3B depicts an effective medium representation of structures within the coarse pitch for light polarized along the Y direction as defined in FIG. 2, in accordance with one or more embodiments of the present disclosure.

FIG. 2 is a top view of polarization-rotating features 202 located on a first layer of an overlay target 106, in accordance with one or more embodiments of the present disclosure.

Referring now specifically to FIG. 2, the polarization-rotating features 202 include grating structures 204 of a first material type separated by areas of a second material type, which is referred to herein as surrounding material 206. For the purposes of the present disclosure, the term grating structures 204 is used herein to refer to a set of features patterned in a sample layer having periodicity that may be characterized by at least one pitch or spatial frequency. In a general sense, grating structures 204 on any particular layer may have multiple periodicities (and associated pitches) in any particular direction and/or may have periodicities in multiple directions.

The polarization-rotating features 202 may be characterized by a coarse pitch 208 (e.g., a coarse period) and a fine pitch 210 (e.g., fine period, a segmentation pitch, a segmentation period, or the like). In particular, features within a coarse pitch 208 are further arranged into two zones 212a,b having orthogonal periodicity with the fine pitch 210. For example, box 214 in FIG. 2 depicts features within a period associated with the coarse pitch 208, which are divided into a first zone 212a characterized by segmentation with the fine pitch 210 along the X direction and a second zone 212b characterized by segmentation with the fine pitch 210 along the Y direction.

It is contemplated herein that the polarization-rotating features 202 illustrated in FIG. 2 operate as a wave plate to impart different phases to light with orthogonal polarization along the fine pitch 210 directions. In this way, the polarization-rotating features 202 may alter or rotate the polarization of incident light (e.g., an illumination beam 104). For example, the polarization-rotating features 202 may operate as a half-wave plate for first-order diffraction in that the polarization-rotating features 202 change the phase of first-order diffraction along the Y direction by π while leaving the phase of first-order diffraction along the X direction unchanged.

FIG. 3A depicts an effective medium representation of structures within a period associated with the coarse pitch 208 (e.g., features within the box 214 in FIG. 2) for light polarized along the X direction as defined in FIG. 2, in accordance with one or more embodiments of the present disclosure. FIG. 3B depicts an effective medium representation of structures within the coarse pitch 208 (e.g., features within the box 214 in FIG. 2) for light polarized along the Y direction as defined in FIG. 2, in accordance with one or more embodiments of the present disclosure.

In FIGS. 3A and 3B, the effective medium for permittivity are defined by the following formulae:

$$\varepsilon_1 = \epsilon_{Gr} \cdot \eta + \epsilon_{sur} \cdot (1 - \eta) \quad (1)$$

$$\varepsilon_2 = \frac{\epsilon_{Gr} \cdot \epsilon_{sur}}{\epsilon_{Gr} \cdot (1 - \eta) + \epsilon_{sur} \cdot \eta}. \quad (2)$$

where $\epsilon_{Gr}$ is a permittivity of grating structures 204 of the first material type, $\epsilon_{sur}$ is a permittivity of the surrounding material 206 of the second material type, and η is a fraction of the coarse pitch 208 associated with the segmentation with the fine pitch 210 along the X direction (e.g., a width of the first zone 212a in FIG. 2 relative to the coarse pitch 208). Put another way, η corresponds to a duty cycle of the orthogonal fine segmentation.

Figure 4:
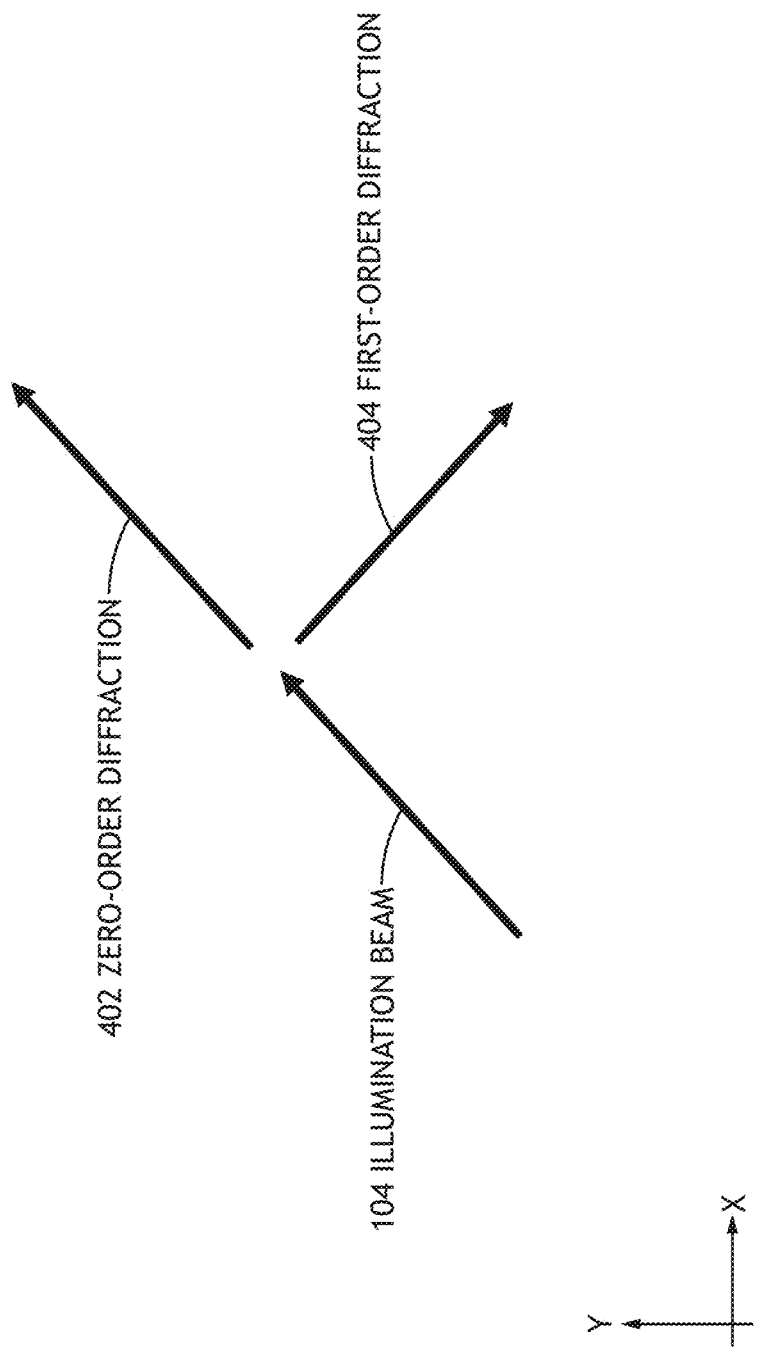
FIG. 4 is a conceptual illustration of an electric field direction of various diffraction orders generated by the polarization-rotating features illustrated in FIG. 2 upon illumination with an illumination beam, in accordance with one or more embodiments of the present disclosure.

As illustrated by equations (1) and (2) along with FIGS. 3A-3B, arranging features on a layer of an overlay target 106 to provide both a coarse pitch 208 and zones of orthogonal fine pitch 210 directions effectively operates as a wave plate and provides different phase shifts for light polarized along the orthogonal directions. FIG. 4 is a conceptual illustration of an electric field direction of various diffraction orders generated by the polarization-rotating features 202 illustrated in FIG. 2 upon illumination with an illumination beam 104, in accordance with one or more embodiments of the present disclosure. As illustrated in FIG. 4, zero-order diffraction 402 may have the same electric field direction as the incident illumination beam 104, whereas first-order diffraction 404 may be orthogonally polarized to the zero-order diffraction 402.

In some embodiments, as illustrated in FIG. 4, an overlay metrology sub-system 102 configured according to a metrology recipe provides an illumination beam 104 that is polarized at a 45-degree angle with respect to the directions of orthogonal fine pitch 210 periodicity (e.g., the X and Y directions in FIG. 2). In this way, the illumination beam 104 will have polarization components along both directions of fine pitch periodicity (e.g., periodicity with the fine pitch 210) such that the polarization-rotating features 202 may alter or rotate the polarization of first-order diffraction of the illumination beam 104 relative to other sample light 110 such as, but not limited to, a DC signal, zero-order diffraction, or higher-order diffraction. In some embodiments, the overlay metrology sub-system 102 is further configured according to the metrology recipe to provide a crossed collection polarizer 130 in the collection pathway 126 oriented to isolate the first-order diffraction 404.

Figure 5:
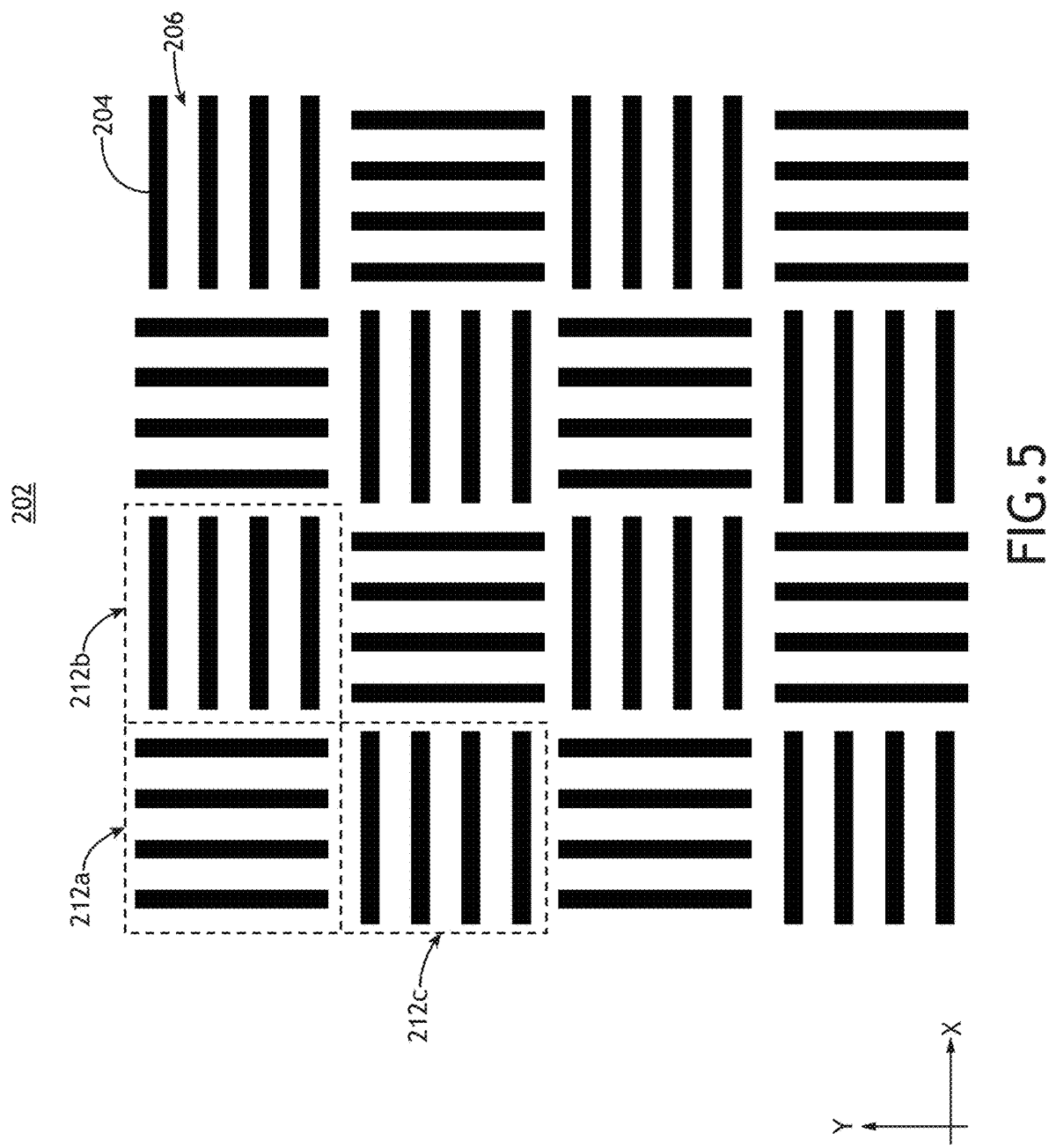
FIG. 5 is a top view of 2D polarization-rotating features suitable for overlay measurements along two measurement directions, in accordance with one or more embodiments of the present disclosure.

Referring now to FIG. 5, FIG. 5 is a top view of 2D polarization-rotating features 202 suitable for overlay measurements along two measurement directions, in accordance with one or more embodiments of the present disclosure. 2D polarization-rotating features 202 may be suitable for use in an overlay target 106 for overlay measurements along two dimensions (e.g., a 2D overlay target 106). As one illustration, the 2D polarization-rotating features 202 illustrated in FIG. 5 may correspond to an extension of the polarization-rotating features 202 illustrated in FIG. 2 along the Y direction. For example, the 2D polarization-rotating features 202 of FIG. 5 are formed as the polarization-rotating features 202 from FIG. 2 in alternating rows and a shifted version of the polarization-rotating features 202 in the interleaving rows. In particular, the polarization-rotating features 202 in the interleaving rows are shifted along the X direction by half of the coarse pitch 208. In this way, features within a coarse pitch 208 along the Y direction are also segmented into zones 212a,c with orthogonal fine-pitch periodicity in a manner similar to the X direction.

Referring generally to FIGS. 2-5, it is to be understood that FIGS. 2-5 are provided solely for illustrative purposes and should not be interpreted as limiting. The polarization-rotating features 202 may have any arrangement suitable for rotating first-order diffraction 404 relative to other sample light 110 such as, but not limited to, zero-order diffraction 402.

For example, the fine pitch 210 need not be the same for the two orthogonal directions (e.g., the fine pitch 210 need not be the same for the first zone 212a and the second zone 212b). As an illustration based on FIG. 2 but not explicitly illustrated, the first zone 212a may have a first fine pitch 210 and the second zone 212b may have a second fine pitch 210 with a different value than the first fine pitch 210. However, the fine pitch 210 in any direction should be sufficiently smaller than a wavelength of the illumination beam 104 (e.g., in accordance with a metrology recipe) to satisfy the effective medium conditions such that equations (1) and (2) are valid. Further, the duty cycle (e.g., associated with the value of η) should be the same for different measurement directions. Considering FIG. 5 as an illustration, the duty cycle along the X direction associated with zones 212a,b should be the same as the duty cycle along the Y direction associated with zones 212a,c.

As another example, the polarization-rotating features 202 may have any duty cycle (e.g., any value of η). However, it may be the case that deviating from a duty cycle of 1:1 (e.g., a value of η=0.5) may reduce the efficacy of the rotation of first-order diffraction by the polarization-rotating features 202 in some designs.

Figure 6:
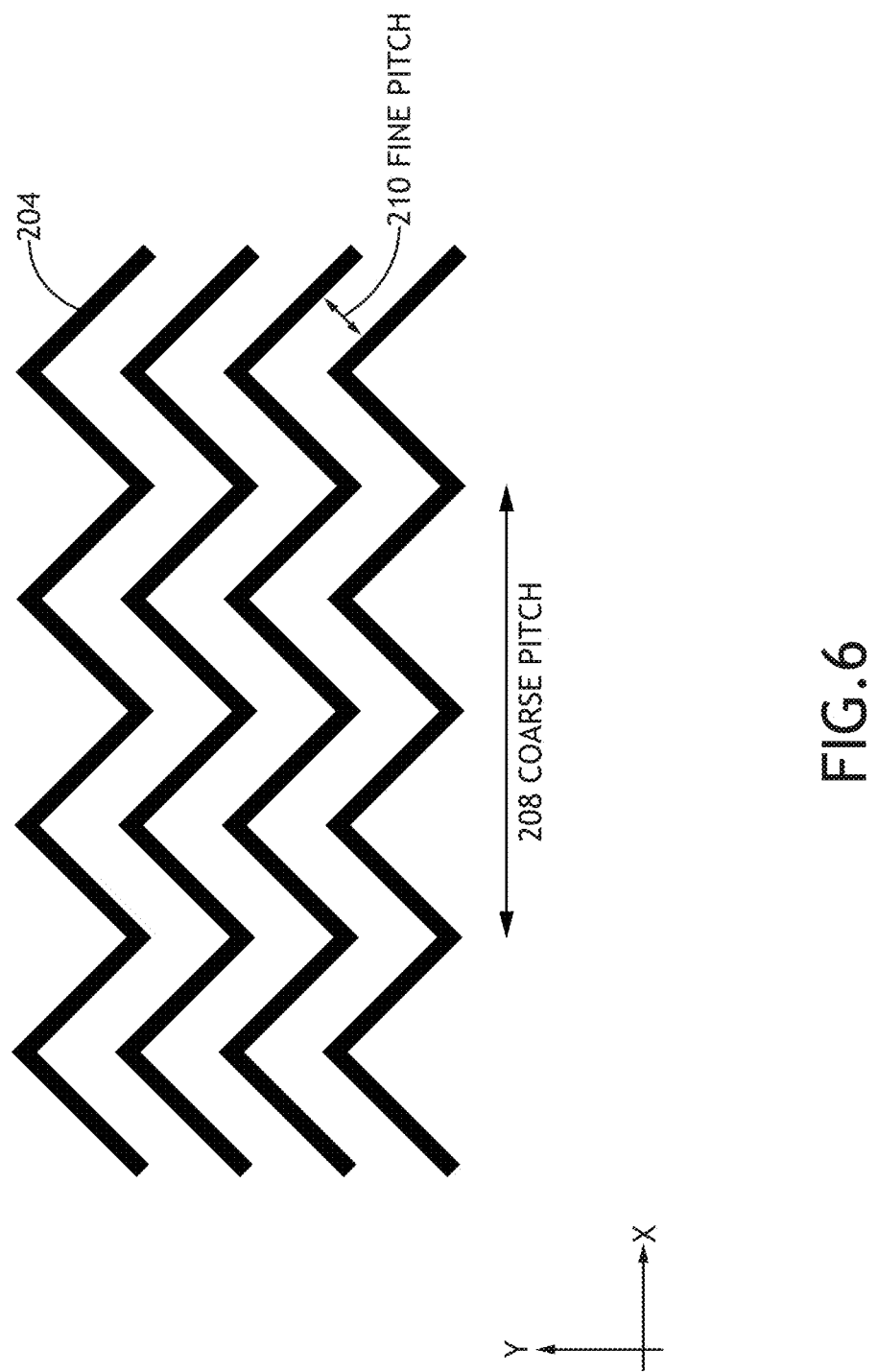
FIG. 6 is a top view of polarization-rotating features arranged with fine pitch periodicity at 45-degree angles with respect to a coarse pitch, in accordance with one or more embodiments of the present disclosure.

For example, polarization-rotating features 202 may be arranged to provide fine pitch periodicity in any two orthogonal directions. As an illustration, FIG. 6 is a top view of polarization-rotating features 202 arranged with fine pitch periodicity at 45-degree angles with respect to a coarse pitch 208, in accordance with one or more embodiments of the present disclosure. In particular, the grating structures 204 are oriented with angles of 45-degrees and 135-degrees with respect to the coarse pitch 208 (here the X direction).

As described previously herein, the illumination beam 104 should be polarized at 45 degrees with respect to both directions of fine pitch periodicity. Accordingly, the illumination beam 104 should be polarized along the X or Y directions for the polarization-rotating features 202 in FIG. 6. Similarly, the overlay metrology sub-system 102 should include a collection polarizer 130 at an orthogonal polarization to capture the rotated first-order diffraction.

As a further example, polarization-rotating features 202 need not necessarily be segmented into separate zones (e.g., zones 212a,b in FIGS. 2-3B and FIG. 5) with distinct fine-pitch segmentation in each zone 212. Rather, it may be sufficient that the polarization-rotating features 202 impart different phases to orthogonal polarizations such that first-order diffraction is rotated relative to other sample light 110 such as, but not limited to, DC signals, zero-order diffraction, or higher-order diffraction. Put another way, polarization-rotating features 202 may have any sizes, orientations, or distributions providing that the effective permittivity distributions for X and Y polarizations impart different phases to orthogonal polarizations in a manner similar to, but not limited to, FIGS. 3A-3B and equations (1)-(2).

Figure 7:
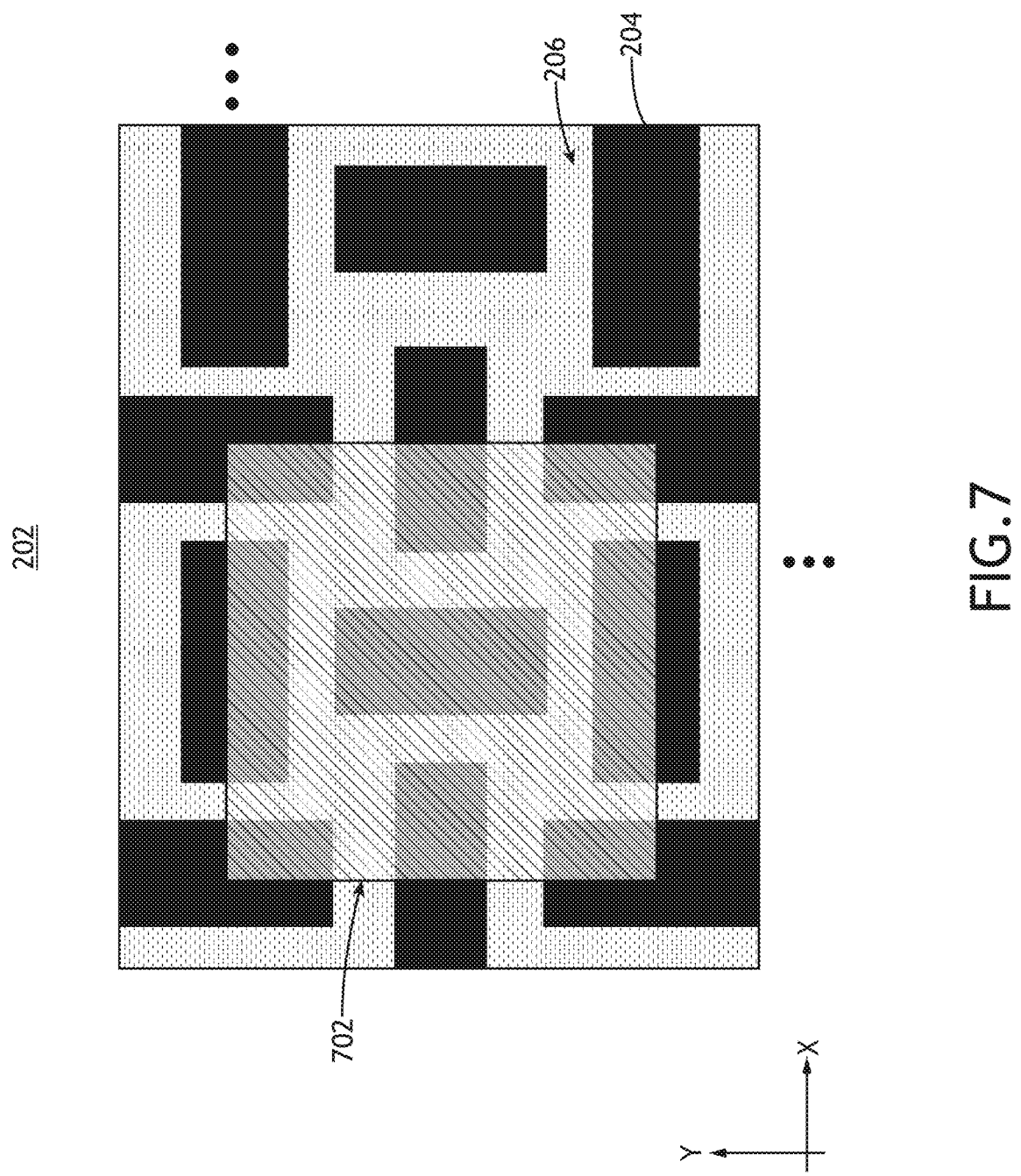
FIG. 7 is a top view of 2D polarization-rotating features without segmentation, in accordance with one or more embodiments of the present disclosure.

As an illustration, FIG. 7 is a top view of a portion of 2D polarization-rotating features 202 without segmentation, in accordance with one or more embodiments of the present disclosure. For example, the 2D polarization-rotating features 202 include features having different orientations and spacings along the X and Y directions such that the 2D polarization-rotating features 202 may operate in a manner similar to the 2D polarization-rotating features 202 in FIG. 5. Further, the box 702 in FIG. 7 depicts one period of the 2D polarization-rotating features 202 (e.g., a coarse pitch 208), where the ellipses in FIG. 7 indicate that the illustrated pattern repeats in two dimensions.

Figure 8B:
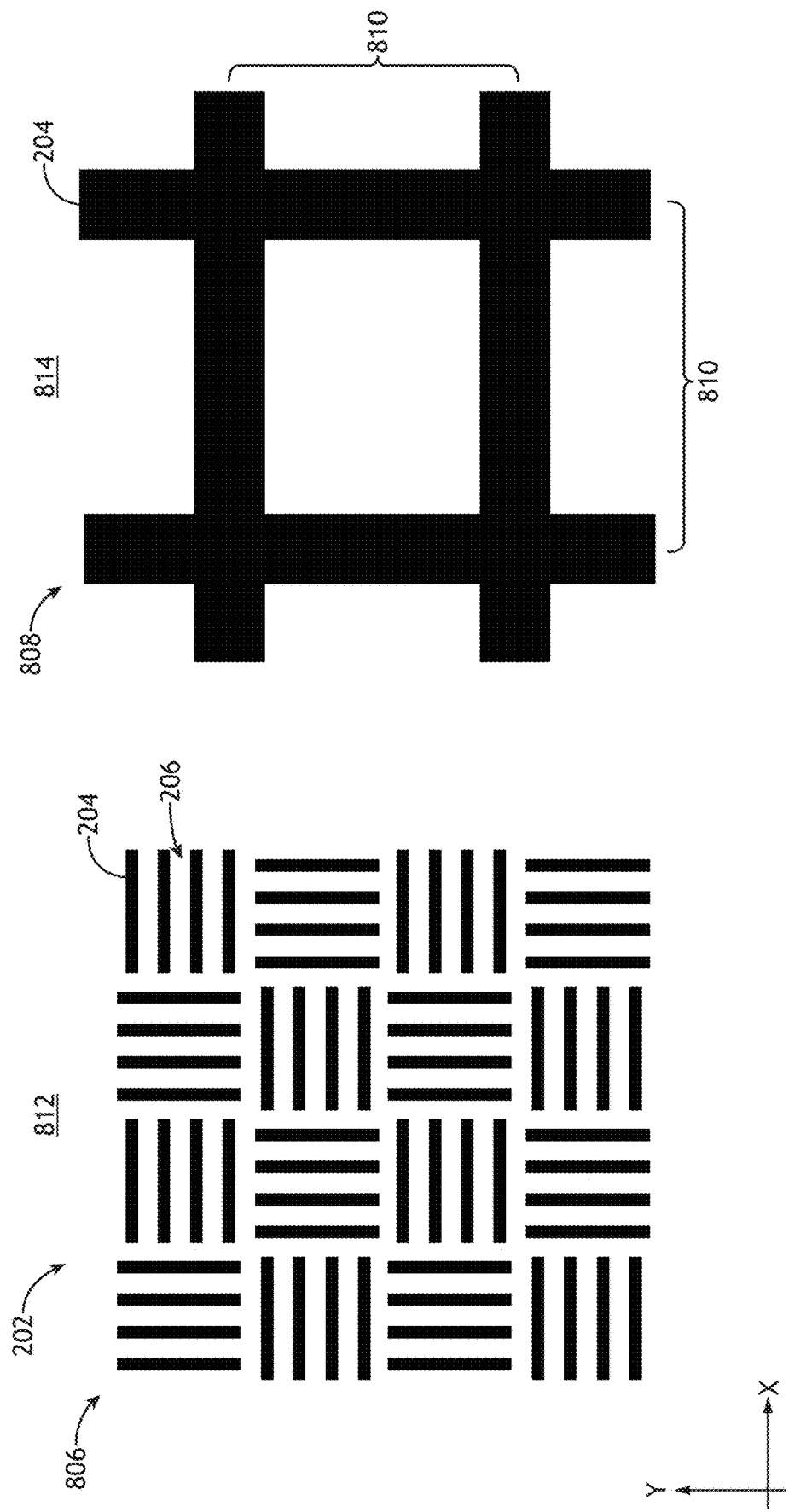
FIG. 8B is a top view of a 2D overlay target suitable for polarization-based isolation of first-order diffraction along two measurement directions, in accordance with one or more embodiments of the present disclosure.
Figure 9:
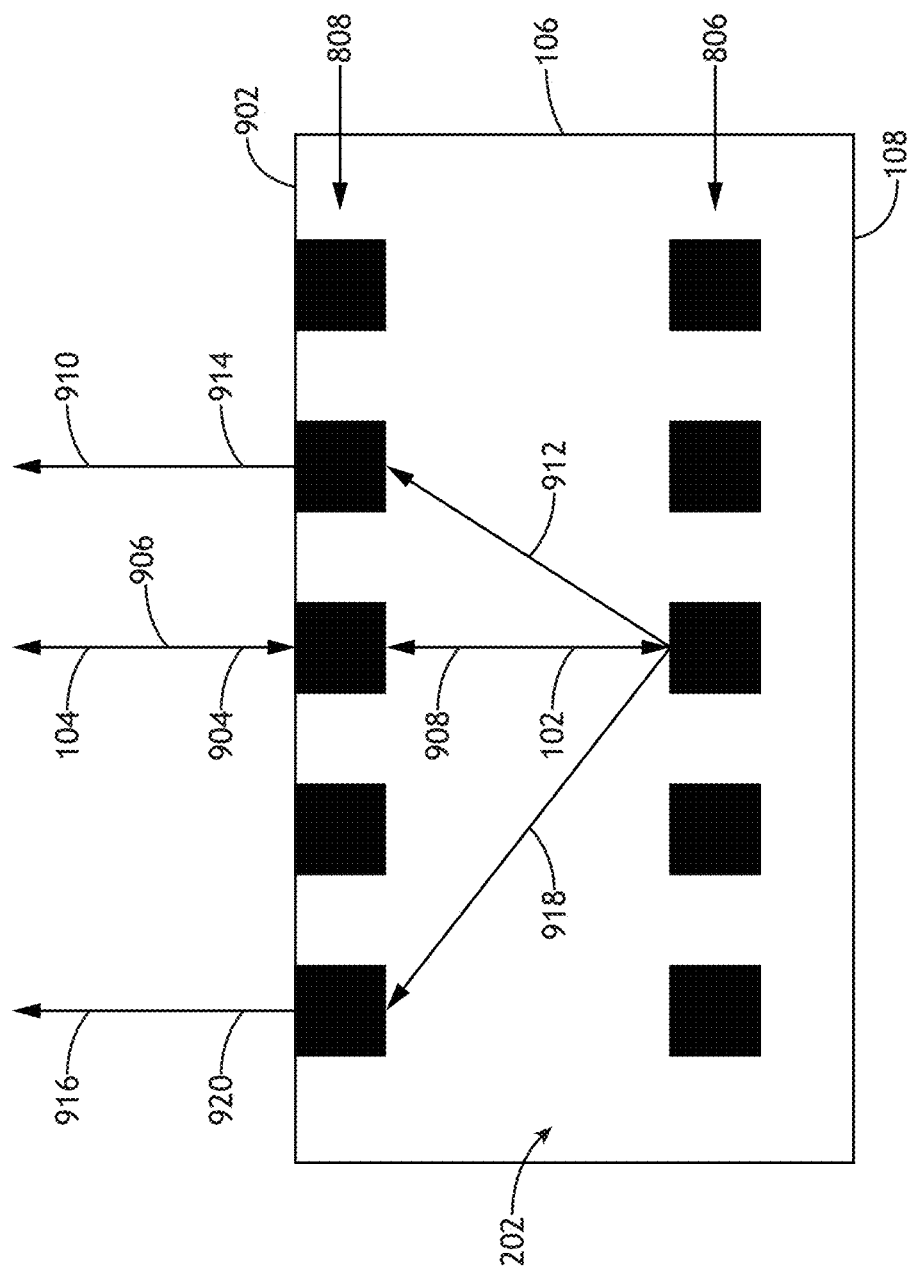
FIG. 9 depicts the use of an overlay target including polarization-rotating features in a grating-over-grating structure for a zero-order SCOL technique, in accordance with one or more embodiments of the present disclosure.
Figure 10:
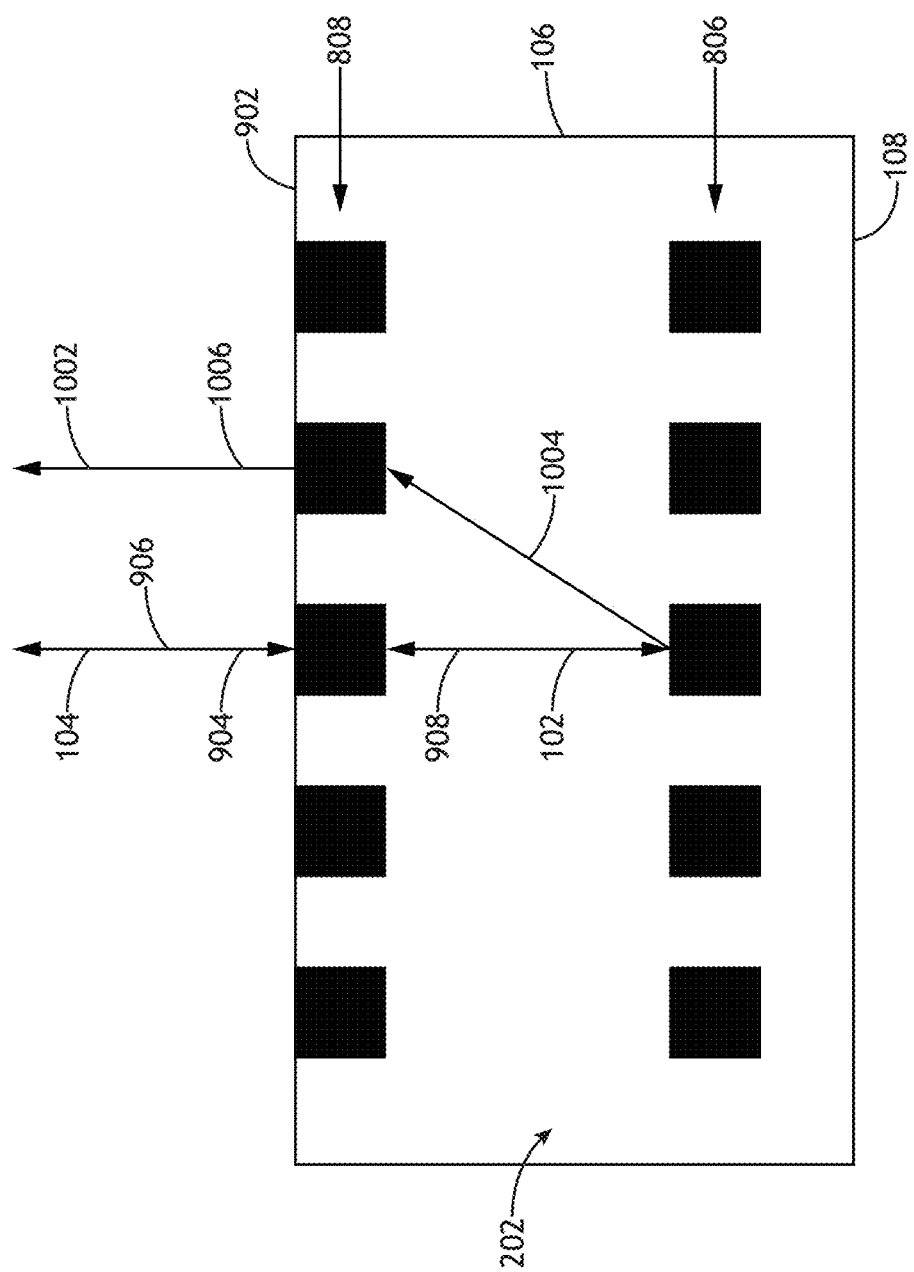
FIG. 10 is a conceptual side view of a grating-over-grating structure illustrating non-limiting components of a Moiré signal, in accordance with one or more embodiments of the present disclosure.

Referring now to FIGS. 8-10, various non-limiting examples of overlay targets 106 incorporating polarization-rotating features 202 are described in greater detail, in accordance with one or more embodiments of the present disclosure.

It is contemplated herein that the efficacy of the polarization-rotating features 202 at rotating first-order diffraction to enable polarization-based isolation of the first-order diffraction may depend on the particular layout and composition of the polarization-rotating features 202.

For example, fabrication of the polarization-rotating features 202 in a process layer with silicon grating structures 204 ($\in_{Gr}$=3.8) with an oxide surrounding material 206 ($\in_{sur}$=1.45) and a 1:1 duty cycle for orthogonally-oriented segmentation (η=0.5) provides effective permittivity values of $\varepsilon_1$=2.63 and $\varepsilon_2$=2.1. This is a similar contrast as obtained with a typical resist-layer target. However, fabrication of the polarization-rotating features 202 in a resist layer (e.g., $\in_{Gr}$=1.4 and $\in_{sur}$=1) with the same 1:1 duty cycle provides effective permittivity values of $\varepsilon_1$=1.2 and $\varepsilon_2$=1.17, which provides minimal contrast and thus relatively poor rotation of the first-order diffraction 404. As a result, polarization-rotating features 202 may be suitable for use in process layers, but may be impractical for use in resist layers (or may have efficacies at polarization rotation below an application tolerance).

As a consequence, it may be impractical to utilize polarization-rotating features 202 in an overlay target 106 in which features on different sample layers (or features associated with different lithographic exposures more generally) are in non-overlapping or side-by-side regions when one of the sample layers is a resist layer. In such a configuration, an amplitude of the first-order diffraction from the features in the resist layer may have a relatively small amplitude due to the relatively small refractive index difference between the features and the surrounding medium. As a result, the signal to noise ratio may be low in this configuration.

However, it is contemplated herein that polarization-rotating features 202 may be well suited for, but not limited to, an overlay target 106 with a grating-over-grating structure. In this configuration, it may be sufficient to provide polarization-rotating features 202 for polarization rotation for first-order diffraction on one layer of the overlay target 106 (e.g., a process layer). As a result, features on the second layer (e.g., a resist layer or a process layer) may have any suitable pattern or orientation without any polarization-rotation requirements.

It is further contemplated herein that any overlay target 106 design including at least one grating-over-grating structure may incorporate polarization-rotating features 202 into at least one layer.

FIG. 8A is a top view of an overlay target 106 suitable for polarization-based isolation of first-order diffraction along a single measurement direction, in accordance with one or more embodiments of the present disclosure. Features in a first sample layer are depicted in a first panel 802 and features in a second sample layer are depicted in second panel 804. In this way, the features in the first panel 802 may constitute a lower grating structure 806 and the features in the second panel 804 may constitute an upper grating structure 808. Combined, the lower grating structure 806 and the upper grating structure 808 may form a grating-over-grating structure.

In some embodiments, the overlay target 106 includes polarization-rotating features 202 in the first layer, which may be a process layer such that the features have a high contrast. For example, the first panel 802 includes a replication of the polarization-rotating features 202 illustrated in FIG. 2. The overlay target 106 may then include any suitable grating structure on the second layer, which may be any type of layer including, but not limited to, a resist layer or a process layer. In this way, the polarization-rotating features 202 may be located in both the first and second layers (e.g., the lower and upper grating structures 806,808) or exclusively in the first layer (e.g., the lower grating structure 806). For example, the second panel 804 illustrates unsegmented features characterized by a pitch 810. This pitch 810 may have different values depending on the particular technique. For instance, an overlay target 106 suitable for SCOL techniques may provide (e.g., in accordance with a metrology recipe) that the pitch 810 of the upper grating structure 808 is equal to the coarse pitch 208 of the polarization-rotating features 202 in the lower grating structure 806. In another instance, an overlay target 106 suitable for Moiré techniques may provide (e.g., in accordance with a metrology recipe) that the pitch 810 of the upper grating structure 808 is different than the coarse pitch 208 of the polarization-rotating features 202 in the lower grating structure 806 to provide a Moiré gain.

FIG. 8B is a top view of a 2D overlay target 106 suitable for polarization-based isolation of first-order diffraction along two measurement directions, in accordance with one or more embodiments of the present disclosure. For example, the third panel 812 includes a replication of the polarization-rotating features 202 illustrated in FIG. 5. The overlay target 106 may then include any suitable grating structure on the second layer, which may be any type of layer including, but not limited to, a resist layer or a process layer. For example, the fourth panel 814 illustrates unsegmented hatch features characterized by the pitch 810.

Although not explicitly illustrated, it is to be understood that an overlay target 106 suitable for overlay measurements along one or two dimensions may be generated based on any design of polarization-rotating features 202 in at least one layer. In cases where polarization-rotating features 202 are located on more than one layer, the polarization-rotating features 202 may be adjusted to provide a desired polarization rotation of first-order diffraction in aggregate.

Referring now to FIGS. 9-10, the use of an overlay target 106 including polarization-rotating features 202 in a grating-over-grating structure is described for a variety of non-limiting overlay techniques. It is contemplated herein that an overlay target 106 including polarization-rotating features 202 in a grating-over-grating structure may be used in any overlay technique that utilizes first-order diffraction from grating-over-grating structures.

FIG. 9 depicts the use of an overlay target 106 including polarization-rotating features 202 in a grating-over-grating structure for a zero-order SCOL technique, in accordance with one or more embodiments of the present disclosure. In particular, FIG. 9 is a conceptual side view of a grating-over-grating structure illustrating non-limiting components of a zero-order SCOL signal, in accordance with one or more embodiments of the present disclosure.

In a zero-order SCOL technique, an overlay measurement may be generated based on measurements of zero-order signals from multiple grating-over-grating structures in different cells of an overlay target 106, where the grating-over-grating structures in the different cells have a common pitch but different predetermined offsets between the constituent grating features. For example, a zero-order SCOL technique may utilize measurements from four or more cells with grating-over-grating structures having different predetermined offsets.

It is noted herein that the term zero-order signal from a grating structure is differentiated from zero-order diffraction. In particular, a zero-order signal in the context of a SCOL measurement includes multiple signals that emanate from a grating-over-grating structure at a common angle. For example, a zero-order signal from a grating-over-grating structure in response to an illumination beam 104 at a normal incidence angle may include multiple light signals emanating from the sample 108 at a normal exit angle.

As illustrated in FIG. 9, an illumination beam 104 may interact with various features of a sample 108 to generate zero-order signals. For example, a zero-order signal may include specular reflection from a top surface 902 of the sample 108 (e.g., a DC signal 904) or other interfaces between sample layers that are not explicitly shown. As another example, a zero-order signal may include zero-order diffraction 906 from an upper grating structure 808, which may propagate along the same path as the DC signal 904.

A zero-order signal may further include various signals associated with combined interactions between the upper grating structure 808 and a lower grating structure 806. As illustrated in FIG. 9, a portion of the illumination beam 104 may pass through the upper grating structure 808 (e.g., as transmitted zero-order diffraction) to reach the lower grating structure 806. The lower grating structure 806 may then generate various reflection diffraction orders from this portion of the illumination beam 104, which may then interact again with the upper grating structure 808 prior to exiting the sample 108.

For example, a zero-order signal from the grating-over-grating structure may include zero-order diffraction 908 from the lower grating structure 806, which passes through the upper grating structure 808 (e.g., as zero-order diffraction). As another example, a zero-order signal from a grating-over-grating structure may include double diffraction from the lower grating structure 806 and upper grating structure 808 with common diffraction orders and opposite signs that exits the sample 108 at a normal exit angle. As an illustration, FIG. 9 depicts light +/−1 diffraction 910 associated with a +1 diffraction order 912 from the lower grating structure 806 and a −1 diffraction order 914 from the upper grating structure 808. Although not shown, light associated with −1 diffraction order from the lower grating structure 806 and a +1 diffraction order from the upper grating structure 808 may follow a symmetric path. As another illustration, FIG. 9 depicts +/−2 order diffraction 916 associated with a −2 diffraction order 918 from the lower grating structure 806 and a +2 diffraction order 920 from the upper grating structure 808. Although not shown, light associated with +2 diffraction order from the lower grating structure 806 and a −2 diffraction order from the upper grating structure 808 may follow a symmetric path. Zero-order SCOL signals may thus include +/−N double diffraction signals following similar patterns for additional diffraction orders.

It is to be understood that the grating-over-grating structure may generate various additional diffraction orders from the lower grating structure 806 and the upper grating structure 808, alone or in combination, which are not explicitly illustrated in FIG. 9 for clarity.

It is contemplated herein that zero-order SCOL techniques may provide relatively high accuracy with relatively low tool induced errors (e.g., tool induced shift (TIS) errors, TIS 36 errors, or the like). However, this approach may suffer from a relatively strong unwanted signal associated with the DC signal 904 and the like as well as algorithmic inaccuracies associated with multiple-order diffraction signals which may difficult, impractical, or sometimes impossible to account for under typical measurement constraints such as, but not limited to, target size or a number of cells within a target needed for a measurement.

It is further contemplated herein that a grating-over-grating structure with polarization-rotating features 202 to rotate a polarization of first-order diffraction from the lower grating structure 806 and/or the upper grating structure 808 may enable optical isolation of this first-order diffraction using a collection polarizer 130 in an overlay metrology sub-system 102 as disclosed herein. For example, the use of a grating-over-grating structure with polarization-rotating features 202 to rotate a polarization of first-order diffraction from the lower grating structure 806 and/or the upper grating structure 808 coupled with a collection polarizer 130 may enable optical isolation of the +/−1 diffraction 910 from other zero-order SCOL signals, which may provide enhanced contrast or signal to noise ratio of an associated overlay measurement. As an illustration, an overlay target 106 configured as illustrated in FIG. 8A may include a grating-over-grating structure in which the pitch 810 of the upper grating structure 808 is equal to a coarse pitch 208 of the lower grating structure 806.

FIG. 10 depicts the use of an overlay target 106 including polarization-rotating features 202 in a grating-over-grating structure for a Moiré technique. In particular, FIG. 10 is a conceptual side view of a grating-over-grating structure illustrating non-limiting components of a Moiré signal, in accordance with one or more embodiments of the present disclosure. For example, a grating-over-grating structure suitable for a Moiré technique (e.g., a Moiré grating-over-grating structure) may provide that the pitch 810 of the upper grating structure 808 is different than the coarse pitch 208 of the lower grating structure 806.

In a manner similar to the illustration in FIG. 9, illuminating a Moiré grating-over-grating structure with an illumination beam 104 may generate various zero-order signals at a normal exit angle including, but not limited to, a DC signal 904 associated with the top surface 902 of the sample 108, zero-order diffraction 906 from the upper grating structure 808, and zero-order diffraction 908 from the lower grating structure 806.

In addition, a Moiré grating-over-grating structure may generate Moiré diffraction associated with double diffraction from both the lower grating structure 806 and the upper grating structure 808. For example, FIG. 10 depicts a Moiré diffraction order 1002 associated with +1 order diffraction 1004 from the lower grating structure 806 and −1 order diffraction 1006 from the upper grating structure 808. Although not explicitly shown, an additional Moiré diffraction order based on −1 order diffraction from the lower grating structure 806 and +1 order diffraction may be generated with a symmetric path. Because the pitch 810 of the upper grating structure 808 is different than the coarse pitch 208 of the lower grating structure 806, the Moiré diffraction order 1002 emanates from the grating-over-grating structure at a non-normal angle. In particular, the exit angle of the Moiré diffraction order 1002 may be based on a difference between these pitches, where exit angle deviates further from a normal exit angle as the different between the pitches increases.

It is contemplated herein that it may be desirable for some applications to provide a Moiré grating-over-grating structure in which the pitches of the upper grating structure 808 and the lower grating structure 806 are close together to provide a high gain and Moiré diffraction with a low Moiré pitch that may be readily resolved even if the underlying pitches of the upper grating structure 808 and lower grating structure 806 are not resolvable.

However, at high gain values, a Moiré diffraction order 1002 may overlap with the various zero-order signals (e.g., a DC signal 904, zero-order diffraction 906 from the upper grating structure 808, and zero-order diffraction 908 from the lower grating structure 806, which may render it impractical to optically isolate a Moiré diffraction order 1002 from the zero-order signals. Further, Moiré techniques with gains in the range of approximately 10 to approximately 300 may present ambiguity issues in overlay measurements that may render these gain factors impractical as well.

In some embodiments, an overlay target 106 includes a grating-over-grating structure with polarization-rotating features 202 in at least one layer to rotate a polarization of first-order diffraction from the lower grating structure 806 and/or the upper grating structure 808. In this way, a Moiré diffraction order 1002 formed from first-order diffraction from both of the lower grating structure 806 and the upper grating structure 808 may be optically isolated using a collection polarizer 130, which may provide enhanced contrast or signal to noise ratio of an associated overlay measurement. It is further contemplated that such a technique may be suitable for, but is not limited to, a Moiré grating-over-grating structure with relatively high gain (e.g., 300 or higher).

In some embodiments, the Moiré gain may be sufficiently high that the Moiré pitch increases to a point that a change of signal associated with overlay is negligible for a given cell size of the overlay target 106. In this case, an image of such a grating-over-grating structure may appear as a greyscale intensity value. Accordingly, an overlay measurement may be generated based on signals generated from multiple (e.g., two or more) grating-over-grating structures (e.g., multiple cells of an overlay target 106) having different predetermined offsets. For example, these greyscale measurements may be fitted to a sinusoidal function with the Moiré pitch to determine the overlay.

Referring generally to FIGS. 9 and 10, it is to be understood that FIGS. 9 and 10, along with the associated descriptions, are provided for illustrative purposes only and should not be interpreted as limiting. Rather, an overlay target 106 including a grating-over-grating structure with polarization-rotating features 202 on at least one sample layer may be utilized in any overlay technique that utilizes first-order diffraction.

Figure 11:
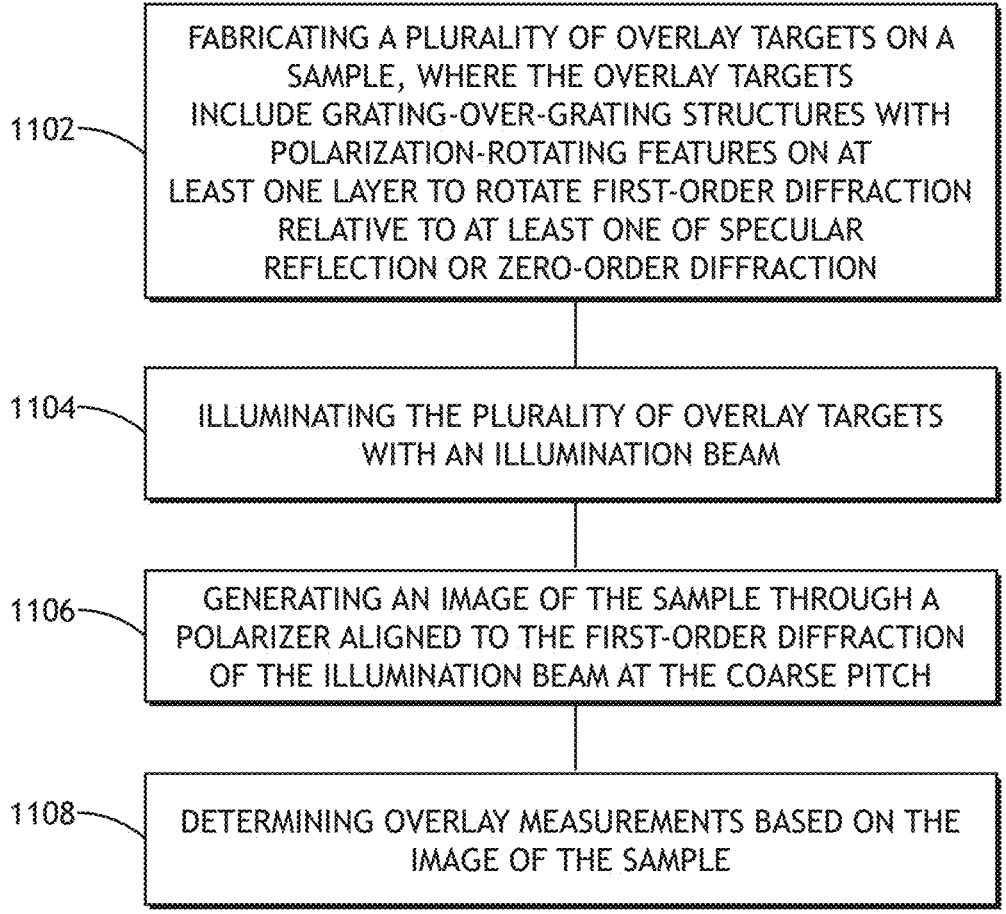
FIG. 11 is a flow diagram illustrating steps performed in a method for high-throughput overlay metrology, in accordance with one or more embodiments of the present disclosure.
Figure 12:
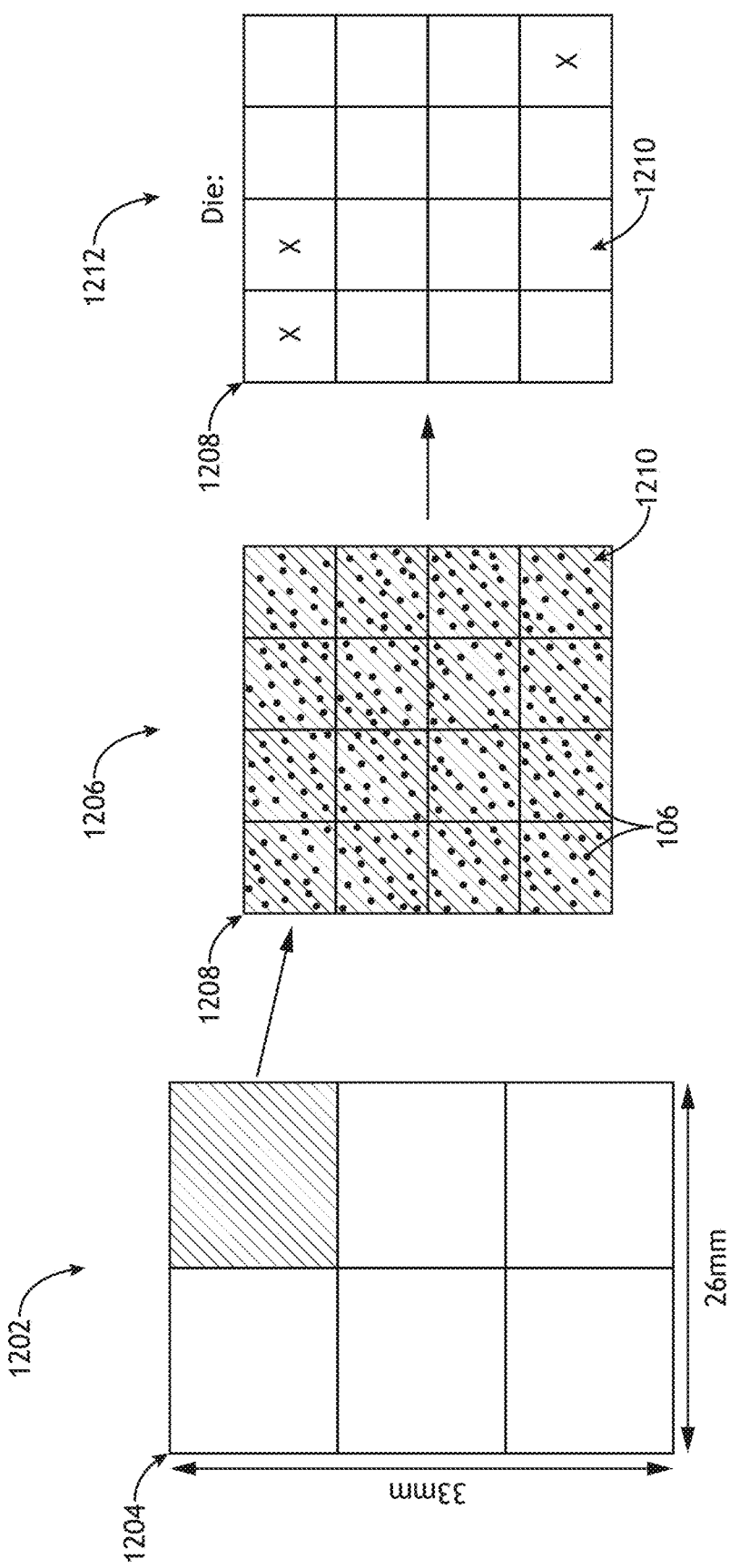
FIG. 12 is a series of high-level diagrams illustrating high-throughput imaging of multiple overlay targets in a single image grab, in accordance with one or more embodiments of the present disclosure.

Referring now to FIGS. 11-12, techniques for characterizing overlay targets 106 providing polarization-rotation of first-order diffraction relative to other sample light 110 are described in greater detail, in accordance with one or more embodiments of the present disclosure.

It is contemplated herein that selective rotation of first-order diffraction using an overlay target 106 and optical isolation of first-order diffraction using a collection polarizer 130 of an overlay metrology sub-system 102 as disclosed herein enables high-throughput imaging of multiple overlay targets 106 within a single field of view. For example, selective rotation of first-order diffraction using an overlay target 106 and optical isolation of first-order diffraction using a collection polarizer 130 of an overlay metrology sub-system 102 as disclosed herein enables isolation of the first-order diffraction from not only additional sample light 110 from an overlay target 106 but also from sample light 110 associated with device features. As a result, such overlay targets 106 may be imaged with a high contrast regardless of the placement on the sample 108.

FIG. 11 is a flow diagram illustrating steps performed in a method 1100 for high-throughput overlay metrology, in accordance with one or more embodiments of the present disclosure. Applicant notes that the embodiments and enabling technologies described previously herein in the context of the overlay metrology system 100 should be interpreted to extend to the method 1100. It is further noted, however, that the method 1100 is not limited to the architecture of the overlay metrology system 100.

In some embodiments, the method 1100 includes a step 1102 of fabricating a plurality of overlay targets 106 on a sample 108, where the overlay targets 106 include grating-over-grating structures with polarization-rotating features 202 on at least one layer to rotate first-order diffraction relative to at least one of specular reflection or zero-order diffraction.

The overlay targets 106, or portions thereof, may be dispersed across a sample 108 in any suitable locations. It is not necessary that different cells (e.g., different grating-over-grating structures) be adjacent to each other. In some embodiments, different cells (e.g., different grating-over-grating structures) of one or more overlay targets 106 are distributed across the sample 108. In this configuration, the various cells of the various overlay targets 106 may be simultaneously imaged in a large field of view and an overlay measurement may be based on a reconstruction of the data from the various cells.

It is further contemplated herein that a particular cell of an overlay target 106 (e.g., as illustrated in FIGS. 8A and 8B) may be fabricated to relatively small sizes since the constituent grating structures need not be individually resolvable. For example, as described previously herein, a grating-over-grating structure suitable for a SCOL technique may appear with a single greyscale intensity associated with an actual registration between the upper grating structure 808 and the lower grating structure 806 (e.g., due to an intentional predetermined offset and/or unintentional overlay errors). As another example, a periodic signal associated with a Moiré diffraction order 1002 (e.g., at a Moiré pitch) may be visible even if constituent grating structures are not resolvable.

As an illustration, a cell of an overlay target 106 including a grating-over-grating structure may have, but is not required to have, a size of approximately 5 microns on a side or less. As a result, the cells are not limited to being placed in scribe lines but may be placed within a die on the sample 108, which may beneficially increase a measurement accuracy due in part to a reduced distance between the cells and the device features of interest.

In some embodiments, the method 1100 includes a step 1104 of illuminating the plurality of overlay targets 106 with an illumination beam 104. In some embodiments, the method 1100 includes a step 1106 of generating an image of the sample 108 through a polarizer aligned to the first-order diffraction of the illumination beam 104 at the coarse pitch 208. For example, an overlay metrology sub-system 102 may be configured (e.g., in accordance with a metrology recipe) to image a relatively large field of view of the sample 108 that includes multiple overlay targets 106 (or portions thereof) through a collection polarizer 130 aligned to pass first-order diffraction as rotated by the overlay targets 106. A resulting image may then reveal the overlay targets 106 with a high contrast. In some embodiments, the method 1100 includes a step 1108 of determining overlay measurements based on the image of the sample 108.

FIG. 12 is a series of high-level diagrams illustrating high-throughput imaging of multiple overlay targets 106 in a single image grab, in accordance with one or more embodiments of the present disclosure.

Panel 1202 depicts a field of view 1204 of an overlay metrology sub-system 102 that may be, but is not required to be, used to perform step 1104 of illuminating the sample 108 and/or step 1106 of imaging the sample 108. Panel 1206 depicts a die 1208 within the field that may include various overlay targets 106 or portions thereof (e.g., individual cells with grating-over-grating structures). In some embodiments, various overlay targets 106 or portions thereof are arranged into sub-sections 1210 of the die 1208 such that separate overlay measurements may be generated based on the overlay targets 106 or portions thereof in the respective sub-sections 1210. Panel 1212 depicts different overlay measurements in each of the sub-sections 1210.

It is contemplated herein that the overlay measurement technique illustrated in FIG. 12 and depicted in FIG. 11 may enable overlay measurements with massive throughput and high accuracy. In a general sense, any number of overlay targets 106 may be simultaneously imaged in a single grab. For example, a field size may be on the order of millimeters or more, whereas the cell sizes (e.g., sizes of the grating-over-grating structures may be, but are not required to be, on the order of 5 micrometers or smaller. In some applications, cell sizes may be on the order of 3 micrometers or smaller. In some applications, cell sizes may be larger than 5 micrometers. As a result, a number of overlay targets 106 that may be simultaneously imaged may be on the order of tens, hundreds, or more. Further, since the collection polarizer 130 may pass first-order diffraction from the overlay targets 106 that is rotated by the overlay targets 106 and block other sources of light (e.g., a DC signal 904, zero-order diffraction 908 from the lower grating structure 806, zero-order diffraction 906 from the upper grating structure 808, light from device features, or the like), a large field of view image may reveal these overlay targets 106 with a high contrast, which may enable overlay measurements with a high sensitivity and/or signal to noise ratio.

It is further contemplated herein that the overlay measurement technique depicted in FIG. 12 is not necessarily limited to overlay targets 106 with polarization-rotating features 202 as described previously herein. Rather, such a technique may be suitable for any overlay target 106 providing diffraction orders of interest in a collection aperture of an overlay metrology sub-system 102.

As an illustration, FIGS. 13A and 13B illustrate configurations of an overlay metrology sub-system 102 for measuring Moiré overlay targets 106 having a relatively small gain (e.g., a gain on the order of 10 or less) that need not necessarily include polarization-rotating features 202. For example, FIGS. 13A and 13B illustration configurations of an overlay metrology sub-system 102 for measuring Moiré overlay targets 106 with only course pitches.

FIG. 13A is a top view of a collection pupil 1302 of an overlay metrology sub-system 102, in accordance with one or more embodiments of the present disclosure. In FIG. 13A, a field of view of a sample 108 including one or more overlay targets 106 (e.g., as depicted in FIG. 12) is illuminated with two oblique illumination beams 104 such that zero-order diffraction lobes 1304 from the constituent upper and lower grating structures as well as a DC signal 904 lie outside a boundary 1306 of the collection pupil 1302, but where first-order diffraction 1308 from the upper and lower grating structures (e.g., upper and lower grating structures 806,808) is within the boundary 1306 of the collection pupil 1302. For example, FIG. 13A illustrates a configuration in which a +1 order diffraction lobe from one of the illumination beams 104 and a −1 order diffraction lobe from another of the illumination beams 104 overlap in a center of the boundary 1306 of the collection pupil 1302. In this configuration, a collection polarizer 130 is not necessary since the first-order diffraction of interest is isolated using optical and/or mechanical techniques.

It is contemplated herein that the configuration illustrated in FIG. 13A may be suitable for large field of view imaging of many overlay targets 106 (e.g., up to 100 or more overlay targets 106 simultaneously) or portions thereof (e.g., cells with Moiré grating-over-grating structures of any type), where the cells may appear as greyscale intensity values based on actual registration between the associated layers of the sample 108. Accordingly, an overlay measurement may be generated based on multiple cells (e.g., two or more cells) with grating-over-grating structures having predetermined offsets. In particular, the obtained intensity values for cells in each overlay target 106 may be fitted to a sinusoidal function having a pitch corresponding to the Moiré pitch of the overlay target 106.

FIG. 13B is a conceptual view of the generation of two illumination beams 104 from an incoherent light source, in accordance with one or more embodiments of the present disclosure. For example, light 1310 from an incoherent light source may be incident on a diffraction grating 1312 or other dispersive optic such that the two illumination beams 104 may be formed as +/1 order diffraction beams of the incoherent light 1310. FIG. 13B further illustrates a beam block 1314 to block zero-order light 1316 and a lens 1318 to collimate the two illumination beams 104.

However, it is to be understood that FIGS. 13A and 13B are provided solely for illustrative purposes and should not be interpreted as limiting. Rather, the technique depicted in FIG. 12 may be utilized for any type of overlay target 106 and configuration of an overlay metrology sub-system 102 suitable for providing imaging of a large field of view on the sample 108 with light isolated to diffraction orders of interest from the overlay target 106.

Referring again to FIGS. 1A and 1B, additional aspects of the overlay metrology sub-system 102 are described in greater detail, in accordance with one or more embodiments of the present disclosure.

The illumination source 112 may include any type of illumination source suitable for providing an illumination beam 104. In some embodiments, the illumination source 112 is a laser source. For example, the illumination source 112 may include, but is not limited to, one or more narrow-band laser sources, a broadband laser source, a supercontinuum laser source, a white light laser source, or the like. In this regard, the illumination source 112 may provide an illumination beam 104 having high coherence (e.g., high spatial coherence and/or temporal coherence). In some embodiments, the illumination source 112 includes a laser-sustained plasma (LSP) source. For example, the illumination source 112 may include, but is not limited to, a LSP lamp, a LSP bulb, or a LSP chamber suitable for containing one or more elements that, when excited by a laser source into a plasma state, may emit broadband illumination. In some embodiments, the illumination source 112 includes a lamp source. For example, the illumination source 112 may include, but is not limited to, an arc lamp, a discharge lamp, an electrode-less lamp, or the like. In this regard, the illumination source 112 may provide an illumination beam 104 having low coherence (e.g., low spatial coherence and/or temporal coherence).

In some embodiments, the overlay metrology system 100 includes a controller 134 communicatively coupled to the overlay metrology sub-system 102. The controller 134 may be configured to direct the overlay metrology sub-system 102 to generate overlay signals based on one or more selected recipes. The controller 134 may be further configured to receive data including, but not limited to, overlay signals from the overlay metrology sub-system 102. Additionally, the controller 134 may be configured to determine overlay associated with an overlay target 106 based on the acquired overlay signals.

In some embodiments, the controller 134 includes one or more processors 136. For example, the one or more processors 136 may be configured to execute a set of program instructions maintained in a memory device 138, or memory.

The one or more processors 136 of a controller 134 may include any processing element known in the art. In this sense, the one or more processors 136 may include any microprocessor-type device configured to execute algorithms and/or instructions. Further, the memory device 138 may include any storage medium known in the art suitable for storing program instructions executable by the associated one or more processors 136. For example, the memory device 138 may include a non-transitory memory medium. As an additional example, the memory device 138 may include, but is not limited to, a read-only memory, a random-access memory, a magnetic or optical memory device (e.g., disk), a magnetic tape, a solid-state drive and the like. It is further noted that memory device 138 may be housed in a common controller housing with the one or more processors 136.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An overlay metrology system comprising:
   an illumination source configured to generate an illumination beam;
   one or more illumination optics to direct the illumination beam to a sample with a field of view including one or more overlay targets when implementing a metrology recipe, wherein a particular one of the one or more overlay targets in accordance with the metrology recipe comprises:
   one or more grating-over-grating structures formed from a lower grating structure with a first coarse pitch and an upper grating structure with a second coarse pitch, wherein the upper grating structure and the lower grating structure overlap on the sample, wherein at least one of the upper grating structure or the lower grating structure further includes features with a fine pitch smaller than a wavelength of the illumination beam and arranged to rotate first-order diffraction of the illumination beam with respect to at least one of specular reflection from a top surface of the sample or zero-order diffraction from the one or more grating-over-grating structures, wherein the first-order diffraction corresponds to +1 diffraction from one of the upper grating structure or the lower grating structure and −1 diffraction from the other of the upper grating structure or the lower grating structure;

an objective lens to collect light from the sample within the field of view when implementing the metrology recipe;

a polarizer arranged to pass portions of the light from the sample associated with the first-order diffraction;

one or more detectors to generate one or more images of the sample including the one or more overlay targets; and a controller communicatively coupled to the one or more detectors, the controller including one or more processors configured to execute program instructions causing the one or more processors to determine overlay measurements of the sample based on the one or more images of the one or more overlay targets.

2. The overlay metrology system of claim 1, wherein at least one of the one or more overlay targets includes two or more of the one or more grating-over-grating structures located in different cells in non-adjacent portions of a die on the sample.

3. The overlay metrology system of claim 1, wherein at least one of the one or more images includes more than 100 overlay targets.

4. The overlay metrology system of claim 1, wherein the first coarse pitch and the second coarse pitch of at least one of the one or more overlay targets are equal to form at least one scatterometry overlay (SCOL) target.

5. The overlay metrology system of claim 4, wherein the at least one SCOL target includes two or more grating-over-grating structures having different predetermined offsets between the upper grating structure and the lower grating structure.

6. The overlay metrology system of claim 4, wherein at least one SCOL target includes four grating-over-grating structures having different predetermined offsets between the upper grating structure and the lower grating structure, wherein an overlay measurement of the at least one SCOL target is generated by a zero-order SCOL technique.

7. The overlay metrology system of claim 1, wherein the first coarse pitch and the second coarse pitch of at least one of the one or more overlay targets are different to form at least one Moiré target.

8. The overlay metrology system of claim 7, wherein the at least one Moiré target includes two or more grating-over-grating structures having different predetermined offsets between the upper grating structure and the lower grating structure.

9. The overlay metrology system of claim 1, wherein the one or more grating-over-grating structures in the one or more overlay targets are unresolved in an associated one of the one or more images of the one or more overlay targets and appear with a greyscale intensity.

10. The overlay metrology system of claim 1, wherein the features with the fine pitch are located exclusively in the lower grating structure in at least one of the one or more overlay targets.

11. The overlay metrology system of claim 10, wherein the lower grating structure is in a process layer of the sample.

12. The overlay metrology system of claim 11, wherein the lower grating structure is in a resist layer of the sample.

13. The overlay metrology system of claim 11, wherein the lower grating structure is in an additional process layer of the sample.

14. The overlay metrology system of claim 1, wherein the features with the fine pitch are arranged into two zones within the first coarse pitch, wherein a direction of the fine pitch in a first zone of the two zones is orthogonal to a direction of the fine pitch in a second zone of the two zones.

15. The overlay metrology system of claim 14, wherein the two zones have a duty cycle of 1:1 within the first coarse pitch.

16. The overlay metrology system of claim 14, wherein the fine pitch in the first zone is equal to the fine pitch in the second zone.

17. The overlay metrology system of claim 14, wherein the fine pitch in the first zone has a different value than the fine pitch in the second zone.

18. The overlay metrology system of claim 14, wherein a direction of the fine pitch in the first zone is parallel to a direction of at least one of the first coarse pitch or the second coarse pitch.

19. The overlay metrology system of claim 14, wherein a direction of the fine pitch in the first zone is at a 45-degree angle with a direction of at least one of the first coarse pitch or the second coarse pitch.

20. The overlay metrology system of claim 1, wherein the one or more images corresponds to optical images of the sample where one or more features of the one or more overlay targets are resolved.

21. The overlay metrology system of claim 1, wherein the one or more images are associated with diffracted orders of radiation from the one or more overlay targets.

22. An overlay metrology target comprising:
one or more grating-over-grating structures formed from a lower grating structure with a first coarse pitch in a first layer of a sample and an upper grating structure with a second coarse pitch in a second layer of the sample, wherein the upper grating structure and the lower grating structure overlap on the sample, wherein at least one of the upper grating structure or the lower grating structure further includes features with a fine pitch smaller than a wavelength of an illumination beam and arranged to rotate first-order diffraction of the illumination beam with respect to at least one of specular reflection from a top surface of the sample or zero-order diffraction from the one or more grating-over-grating structures, wherein the first-order diffraction corresponds to +1 diffraction from one of the upper grating structure or the lower grating structure and −1 diffraction from the other of the upper grating structure or the lower grating structure, wherein overlay between the first layer and the second layer of the sample is determinable from one or more images of the one or more grating-over-grating structures based on the first-order diffraction.

23. The overlay metrology target of claim 22, wherein the first coarse pitch and the second coarse pitch are equal to form a scatterometry overlay (SCOL) target.

24. The overlay metrology target of claim 23, wherein the SCOL target includes two or more grating-over-grating structures having different predetermined offsets between the upper grating structure and the lower grating structure.

25. The overlay metrology target of claim 22, wherein the first coarse pitch and the second coarse pitch are different to form a Moiré target.

26. The overlay metrology target of claim 25, wherein the Moiré target includes two or more grating-over-grating structures having different predetermined offsets between the upper grating structure and the lower grating structure.

27. The overlay metrology target of claim 22, wherein the features with the fine pitch are located exclusively in the lower grating structure.

28. The overlay metrology target of claim 27, wherein the lower grating structure is in a process layer of the sample.

29. The overlay metrology target of claim 28, wherein the lower grating structure is in a resist layer of the sample.

30. The overlay metrology target of claim 28, wherein the lower grating structure is in an additional process layer of the sample.

31. The overlay metrology target of claim 22, wherein the features with the fine pitch are arranged into two zones within each coarse pitch, wherein a direction of the fine pitch in a first zone of the two zones is orthogonal to a direction of the fine pitch in a second zone of the two zones.

32. The overlay metrology target of claim 31, wherein the two zones have a duty cycle of 1:1 within the first coarse pitch.

33. The overlay metrology target of claim 31, wherein the fine pitch in the first zone is equal to the fine pitch in the second zone.

34. The overlay metrology target of claim 31, wherein the fine pitch in the first zone has a different value than the fine pitch in the second zone.

35. The overlay metrology target of claim 31, wherein a direction of the fine pitch in the first zone is parallel to a direction of at least one of the first coarse pitch or the second coarse pitch.

36. The overlay metrology target of claim 31, wherein a direction of the fine pitch in the first zone is at a 45-degree angle with a direction of at least one of the first coarse pitch or the second coarse pitch.

37. An overlay metrology method comprising:
fabricating one or more overlay targets on a sample, wherein a particular one of the one or more overlay targets comprises:
one or more grating-over-grating structures formed from a lower grating structure with a first coarse pitch and an upper grating structure with a second coarse pitch, wherein the upper grating structure and the lower grating structure overlap on the sample, wherein at least one of the upper grating structure or the lower grating structure further includes features with a fine pitch smaller than a wavelength of an illumination beam and arranged to rotate first-order diffraction of the illumination beam with respect to at least one of specular reflection from a top surface of the sample or zero-order diffraction from the one or more grating-over-grating structures, wherein the first-order diffraction corresponds to +1 diffraction from one of the upper grating structure or the lower grating structure and −1 diffraction from the other of the upper grating structure or the lower grating structure;
illuminating the one or more overlay targets with the illumination beam;
generating one or more images of the sample through a polarizer aligned to pass the first-order diffraction; and
determining overlay measurements based on the one or more images of the sample.

38. The overlay metrology method of claim 37, wherein at least one of the one or more overlay targets includes two or more of the one or more grating-over-grating structures located in different cells in non-adjacent portions of a die on the sample.

39. The overlay metrology method of claim 37, wherein at least one of the one or more images includes more than 100 overlay targets.

40. The overlay metrology method of claim 37, wherein the first coarse pitch and the second coarse pitches pitch of at least one of the one or more overlay targets are equal to form at least one scatterometry overlay (SCOL) target.

41. The overlay metrology method of claim 40, wherein the at least one SCOL target includes two or more grating-over-grating structures having different predetermined offsets between the upper grating structure and the lower grating structure.

42. The overlay metrology method of claim 40, wherein at least one SCOL target includes four grating-over-grating structures having different predetermined offsets between the upper grating structure and lower grating structure, wherein an overlay measurement of the at least one SCOL target is generated by a zero-order SCOL technique.

43. The overlay metrology method of claim 37, wherein the first coarse pitch and the second coarse pitch of at least one of the one or more overlay targets are different to form at least one Moiré target.

44. The overlay metrology method of claim 37, wherein the one or more grating-over-grating structures in the one or more overlay targets are unresolved in an associated one of the one or more images of the one or more overlay targets and appear with a greyscale intensity.

45. The overlay metrology method of claim 37, wherein the features with the fine pitch are located exclusively in the lower grating structure in at least one of the one or more overlay targets.

* * * * *